US009450635B2

(12) United States Patent
Adiletta et al.

(10) Patent No.: US 9,450,635 B2
(45) Date of Patent: Sep. 20, 2016

(54) CABLELESS CONNECTION APPARATUS AND METHOD FOR COMMUNICATION BETWEEN CHASSIS

(71) Applicant: Intel Corporation, Santa Clara, CA (US)

(72) Inventors: Matthew J. Adiletta, Bolton, MA (US); Aaron Gorius, Upton, MA (US); Myles Wilde, Charlestown, MA (US); Hugh Wilkinson, Newton, MA (US); Amit Y. Kumar, Marlborough, MA (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 14/244,475

(22) Filed: Apr. 3, 2014

(65) Prior Publication Data

US 2015/0288410 A1 Oct. 8, 2015

(51) Int. Cl.
*H04B 1/38* (2015.01)
*H04B 1/40* (2015.01)
*H04L 12/933* (2013.01)
*H04L 12/931* (2013.01)
*H04L 29/08* (2006.01)

(52) U.S. Cl.
CPC ............... *H04B 1/40* (2013.01); *H04L 49/10* (2013.01); *H04L 49/35* (2013.01); *H04L 67/10* (2013.01)

(58) Field of Classification Search
CPC .................................................. H04L 49/10
USPC ........................... 455/73, 575.1, 575.7
See application file for complete search history.

(56) References Cited

U.S. PATENT DOCUMENTS

| 2006/0212636 | A1 | 9/2006 | Yasuo et al. |
| 2006/0234787 | A1* | 10/2006 | Lee .................. H05K 7/1412 455/575.7 |
| 2007/0115954 | A1* | 5/2007 | Wu ..................... G06F 13/4072 370/359 |
| 2009/0234936 | A1 | 9/2009 | Bandholz et al. |
| 2011/0130093 | A1 | 6/2011 | Walley et al. |
| 2011/0228779 | A1 | 9/2011 | Goergen et al. |

(Continued)

FOREIGN PATENT DOCUMENTS

| WO | 2015/148124 A1 | 10/2015 |
| WO | 2015/153088 A1 | 10/2015 |

OTHER PUBLICATIONS

Chen et al., "A 6-Gb/s Wireless Inter-Chip Data Link Using 43-GHz Transceivers and Bond-Wire Antennas", IEEE Journal of Solid-State Circuits, vol. 44, No. 10, Oct. 2009, pp. 2711-2721.
International Search Report and Written Opinion received for PCT Patent Application No. PCT/US2015/019940, mailed on Jul. 3, 2015, 15 pages.
International Search Report and Written Opinion received for PCT Patent Application No. PCT/US2015/019952, mailed on Aug. 28, 2015, 16 pages.

*Primary Examiner* — Hsin-Chun Liao
(74) *Attorney, Agent, or Firm* — Law Office of R. Alan Burnett, PS

(57) ABSTRACT

Apparatus and methods for cableless connection of components within chassis and between separate chassis. Pairs of Extremely High Frequency (EHF) transceiver chips supporting very short length millimeter-wave wireless communication links are configured to pass radio frequency signals through holes in one or more metal layers in separate chassis and/or frames, enabling components in the separate chassis to communicate without requiring cables between the chassis. Various configurations are disclosed, including multiple configurations for server chassis, storage chassis and arrays, and network/switch chassis. The EHF-based wireless links support link bandwidths of up to 6 gigabits per second, and may be aggregated to facilitate multi-lane links.

16 Claims, 27 Drawing Sheets

(56) References Cited

U.S. PATENT DOCUMENTS

| | | |
|---|---|---|
| 2012/0311127 A1 | 12/2012 | Kandula et al. |
| 2013/0017818 A1 | 1/2013 | Rofougaran |
| 2013/0107853 A1* | 5/2013 | Pettus .................. H04W 84/10 370/330 |
| 2013/0191567 A1 | 7/2013 | Rofougaran et al. |
| 2015/0280827 A1 | 10/2015 | Adiletta et al. |

* cited by examiner

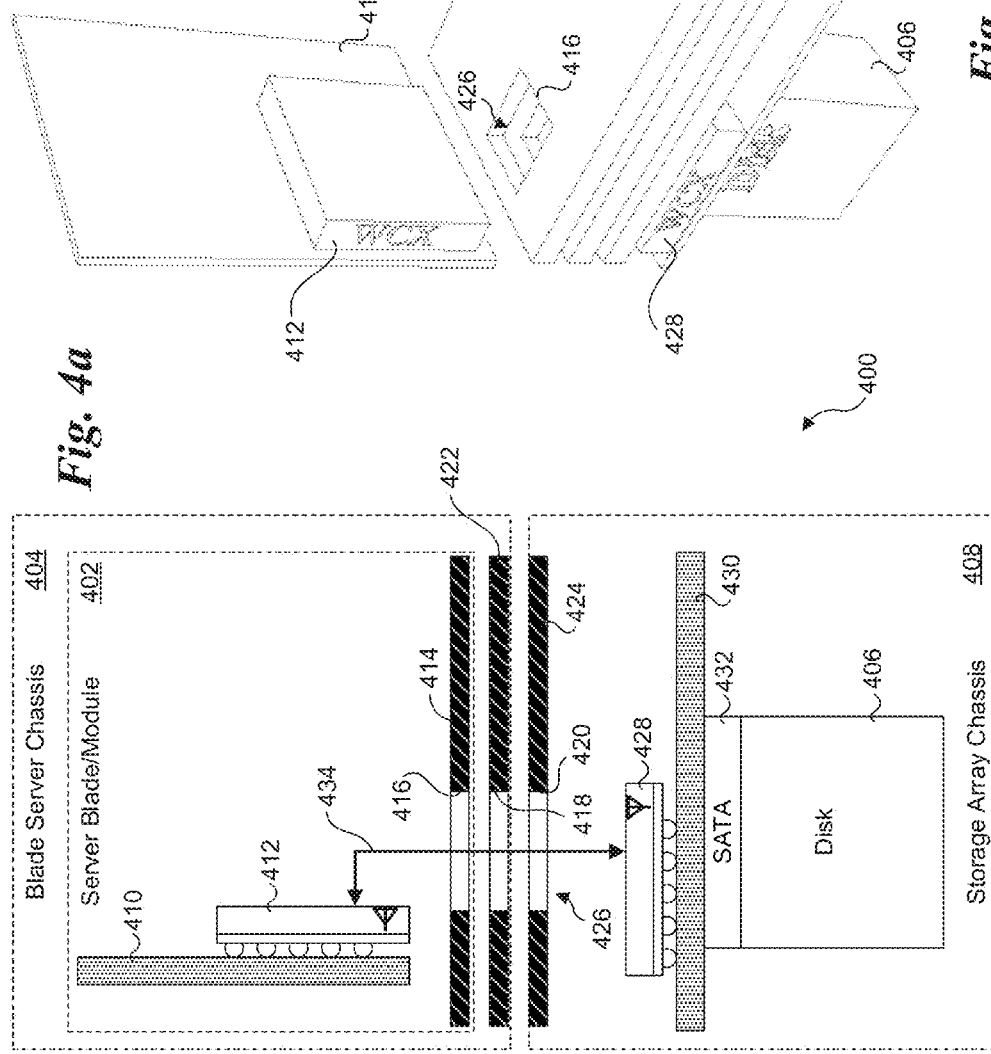

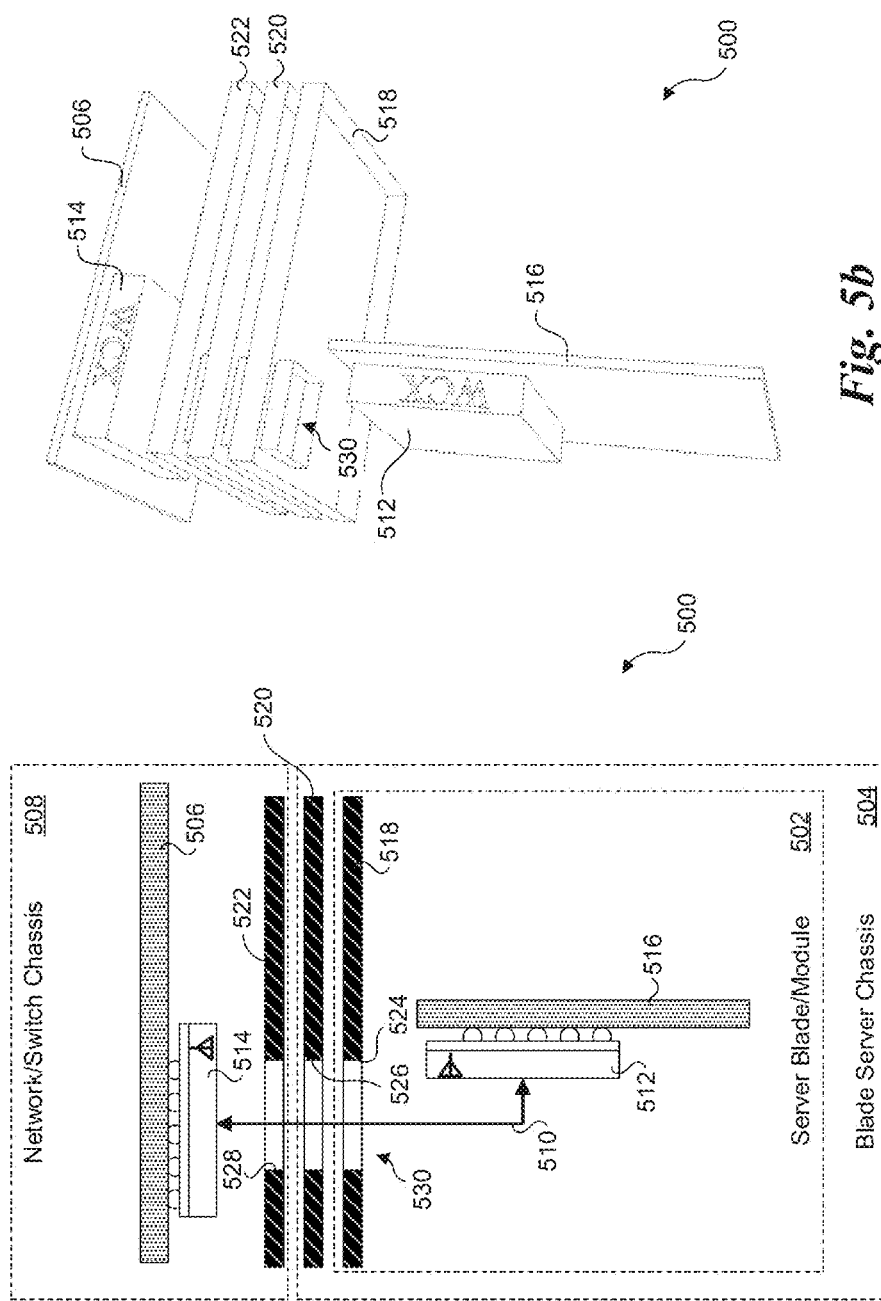

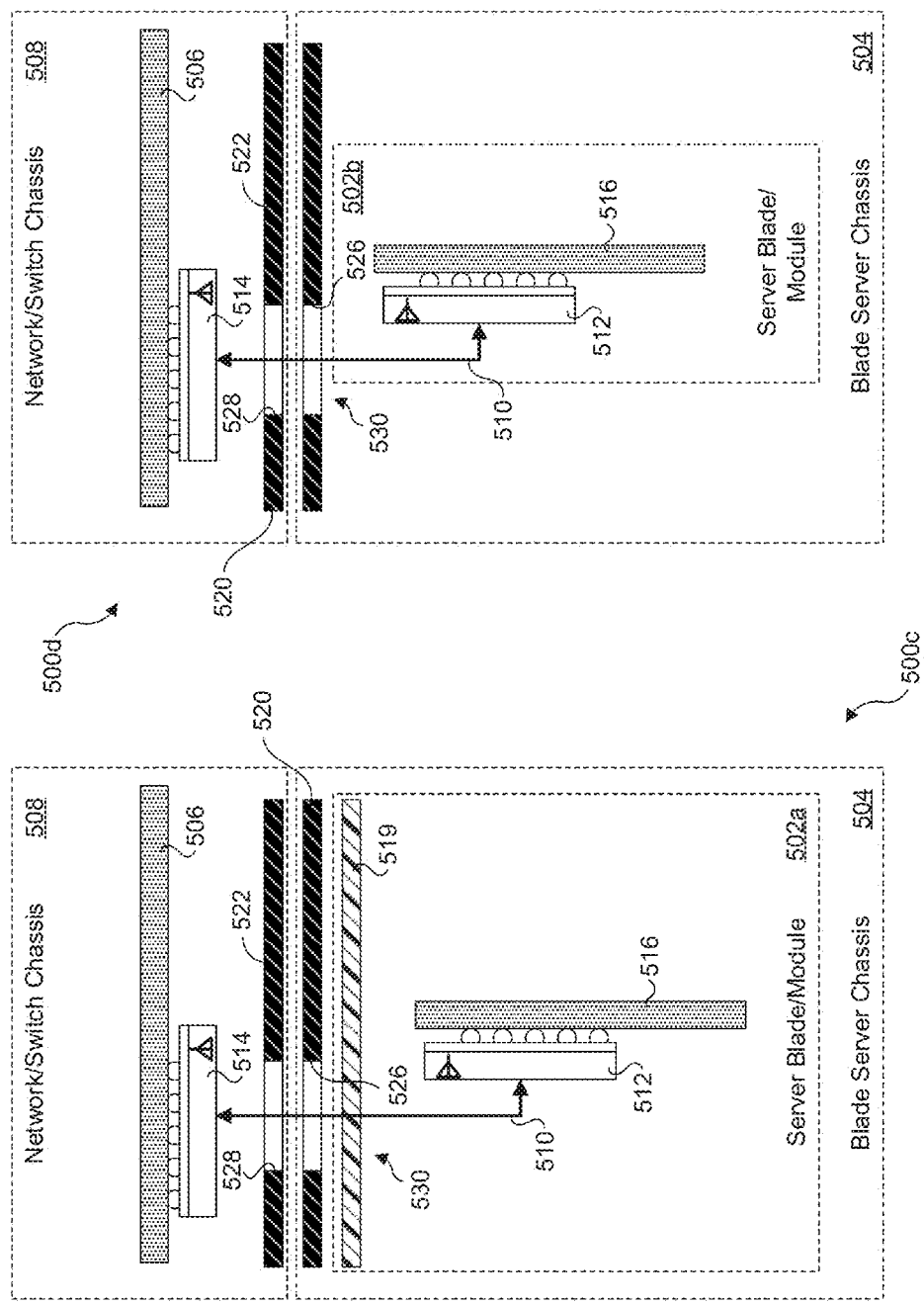

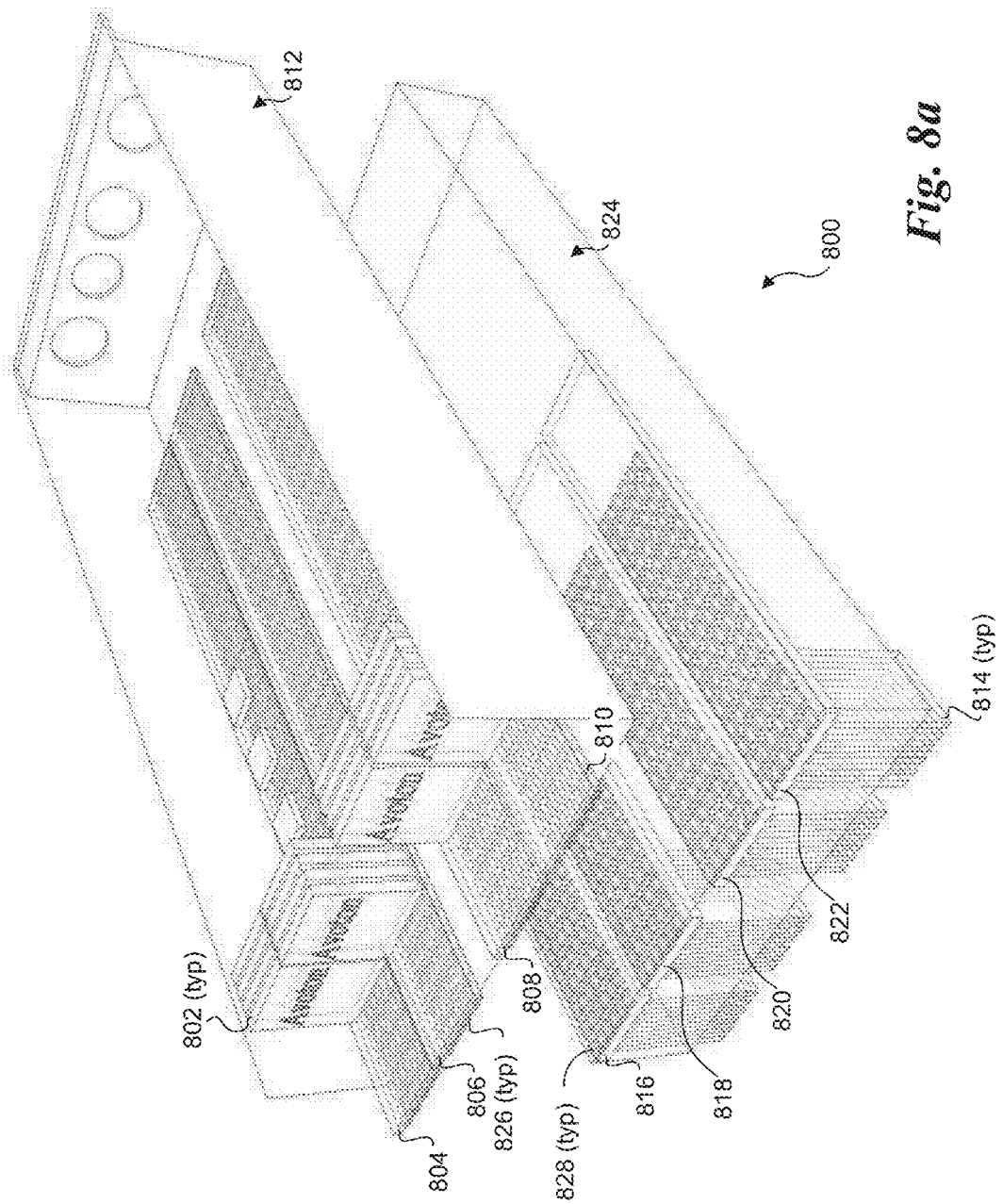

CABLELESS CONNECTION APPARATUS AND METHOD FOR COMMUNICATION BETWEEN CHASSIS

CROSS-REFERENCE TO RELATED APPLICATION

The present application includes subject matter related to subject matter disclosed in U.S. application Ser. No. 14/227,497, entitled RACK LEVEL PRE-INSTALLED INTERCONNECT FOR ENABLING CABLELESS SERVER/STORAGE/NETWORKING DEPLOYMENT, filed Mar. 27, 2014.

BACKGROUND INFORMATION

Ever since the introduction of the microprocessor, computer systems have been getting faster and faster. In approximate accordance with Moore's law (based on Intel® Corporation co-founder Gordon Moore's 1965 publication predicting the number of transistors on integrated circuits to double every two years), the speed increase has shot upward at a fairly even rate for nearly three decades. At the same time, the size of both memory and non-volatile storage has also steadily increased, such that many of today's personal computers are more powerful than supercomputers from just 10-15 years ago. In addition, the speed of network communications has likewise seen astronomical increases.

Increases in processor speeds, memory, storage, and network bandwidth technologies have resulted in the build-out and deployment of networks with ever increasing capacities. More recently, the introduction of cloud-based services, such as those provided by Amazon (e.g., Amazon Elastic Compute Cloud (EC2) and Simple Storage Service (S3)) and Microsoft (e.g., Azure and Office 365) has resulted in additional network build-out for public network infrastructure, in addition to the deployment of massive data centers to support these services that employ private network infrastructure.

Cloud-based services are typically facilitated by a large number of interconnected high-speed servers, with host facilities commonly referred to as server "farms" or data centers. These server farms and data centers typically comprise a large-to-massive array of rack and/or blade servers housed in specially-designed facilities. Many of the larger cloud-based services are hosted via multiple data centers that are distributed across a geographical area, or even globally. For example, Microsoft Azure has multiple very large data centers in each of the United States, Europe, and Asia. Amazon employs co-located and separate data centers for hosting its EC2 and AWS services, including over a dozen AWS data centers in the US alone.

In order for the various server blades and modules to communicate with one another and to data storage, an extensive amount of cabling is used. Installing the cabling is very time-consuming and prone to error. In addition, the cost of the cables and connectors themselves are significant. For example, a 3-foot SAS (Serial attached SCSI) cable may cost $45 alone. Multiply this by thousands of cables and installations, and the costs add up quickly, as does the likelihood of cabling errors.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIGS. 3a-3d illustrate launch orientations between pairs of EHF transceiver chips, wherein FIG. 3a depicts a vertical launch, FIG. 3b depicts an offset vertical launch, FIG. 3c depicts a side launch, and FIG. 3d depicts a diagonal launch;

FIGS. 4a and 4b illustrate a millimeter-wave wireless link between respective EHF transceiver chips in a blade server chassis above a storage array chassis under which signals are passed through holes in three metal layers, according to one embodiment;

FIGS. 5a and 5b illustrate a millimeter-wave wireless link between respective EHF transceiver chips in a network/switch chassis above a blade server chassis under which signals are passed through holes in three metal layers, according to one embodiment;

FIG. 5c illustrates a millimeter-wave wireless link between respective EHF transceiver chips in a network/switch chassis above a blade server chassis under which signals are passed through one plastic layer and holes in two metal layers, according to one embodiment;

FIG. 5d illustrates a millimeter-wave wireless link between respective EHF transceiver chips in a network/switch chassis above a blade server chassis under which signals are passed through holes in two metal layers, according to one embodiment;

FIGS. 8a and 8b illustrate a configuration under which an array of EHF transceiver chips in a server chassis are wirelessly linked with an array of EHF transceiver chips in a storage chassis below the server chassis, according to one embodiment;

DETAILED DESCRIPTION

Figure 1:
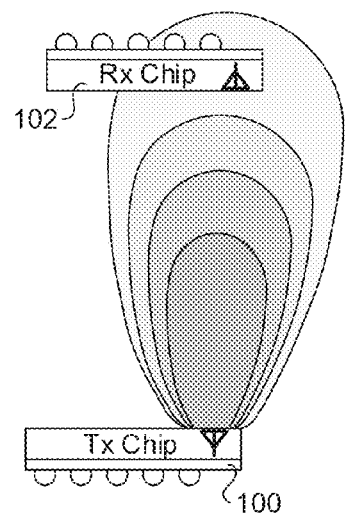
FIG. 1 is a diagram illustrate a radio frequency antenna output emitted from a transmitter EHF transceiver chip and being received by a receiver EHF transceiver chip.

Embodiments of apparatus and methods for cableless connection of components within chassis and between separate chassis are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

In accordance with aspects of the embodiments disclosed herein, Extremely High Frequency (EHF) wireless communication links are used in place of conventional cabling techniques, resulting in reductions in both system component costs and labor costs. The Extremely High Frequency range is approximately 30 GHz-300 GHz. The embodiments leverage recent advancements in very short length millimeter-wave wireless transceiver chips to facilitate contactless communication links for blade server and other high-density module configurations applicable for data centers and the like. Additionally, the embodiments facilitate use of existing and future server blade and server module configurations.

FIG. 1 illustrates radio frequency (RF) signal energy being output by an antenna in a first EHF transceiver chip 100 operating as a transmitter (Tx or TX) and being received by a second EHF transceiver chip 102 that is operating as a receiver (Rx or RX). As illustrated by the darker shading representing higher energy density, the electromagnetic field strength of the RF signal dissipates with distance from the transmitter.

In one embodiment, each of EHF chips 100 and 102 comprise EHF chips manufactures by WaveConnex, Inc., Mountainview, Calif. In one embodiment, the EHF chips illustrated in the Figures herein comprise a WaveConnex WCX102 (or WCX102b) transceiver chip. Details of the structure and operations of the millimeter-wave technology implemented in the WaveConnex chips are disclosed in U.S. Pat. No. 8,554,136 entitled "TIGHTLY-COUPLED NEAR-FIELD COMMUNICATION-LINK CONNECTOR-REPLACEMENT CHIPS," and U.S. application Ser. No. 13/471,052 (U.S. Pub. No. 2012/0286049 A1) and Ser. No. 13/471,058 (U.S. Pub. No. 2012/0290760 A1), both entitled "SCALABLE HIGH-BANDWIDTH CONNECTIVITY."

Figure 2:
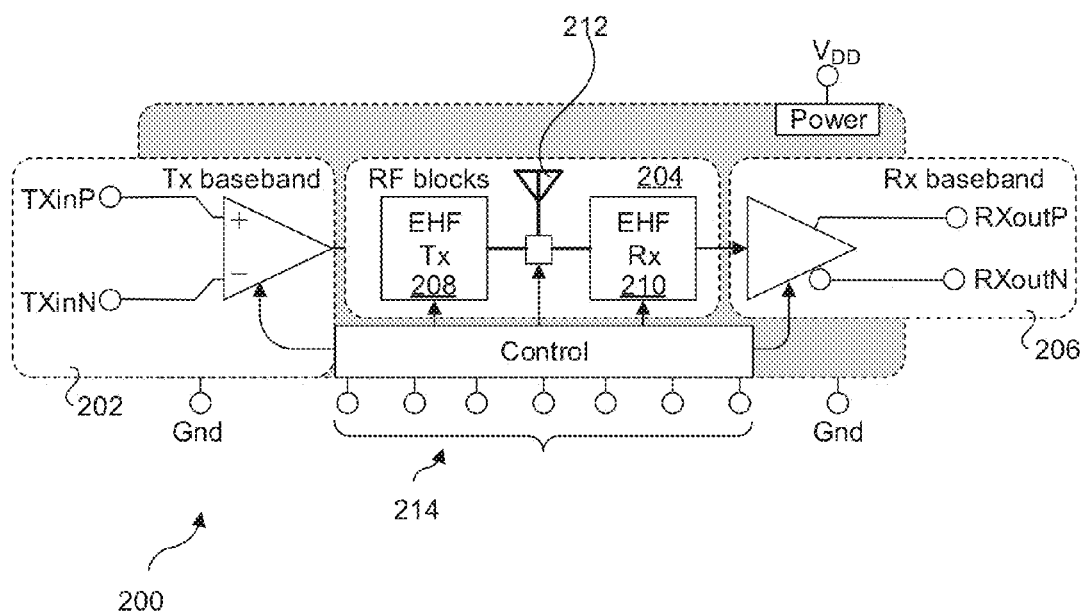
FIG. 2 is a block diagram of one embodiment of an EHF transceiver chip.

FIG. 2 shows a block diagram 200 of an embodiment of an EHF transceiver chip. The basic chip blocks includes a Tx baseband block 202, RF blocks 204, and an Rx baseband block 206. The RF blocks include an EHF transmitter block 208, an EHF receiver block 210, and an antenna 212. The EHF chip is configured to receive a stream of data to be transmitted from an external component using a differential signal at pins TXinP (positive) and TXinN (negative). The input transmitted digital stream is processed by Tx baseband block 202 and EHF transmitter block 208 to create a modulated RF signal that is radiated output from antenna 212. Antenna 212 also receives signals transmitted from a paired EHF transceiver of similar configuration (not) shown, with the received signals processed by EHF receiver block 210 and Rx baseband block 206 to generate a received bitstream encoded using differential signaling that is output at the RXoutP and RXoutN pins. In one embodiment, the EHF transceiver chip employs a 60 GHz carrier that is generated on-chip, with the modulated signal sent to antenna 212 for transmission.

The EHF transceiver chip includes multiple control inputs 214 that are used for various control and configuration purposes. The control inputs enable the transceiver chip to be configured in two operating modes, including a high-speed mode, intended for use with DC balanced differential signals that is suitable for signals running from 100 Mb/s to 6.0 Gb/s and features support for envelope-based Out-of-Band (OOB) signaling used in Serial-Attached-SCSI (SAS) and Serial Advanced Technology Attachment (SATA), as well as electrical idle and Low Frequency Periodic Signaling (LFPS) signals in Peripheral Component Interconnect Express (PCIe) and Universal Serial Bus version 3.0 (USB 3.0).

Figure 3A:
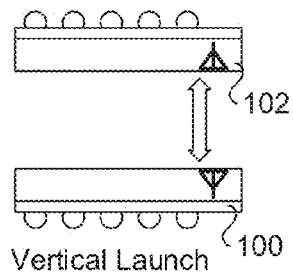
Figure 3B:
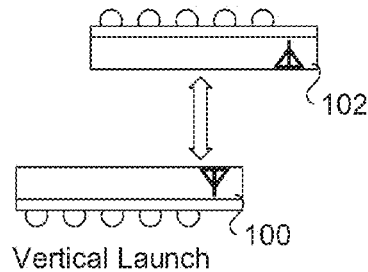
Figure 3C:
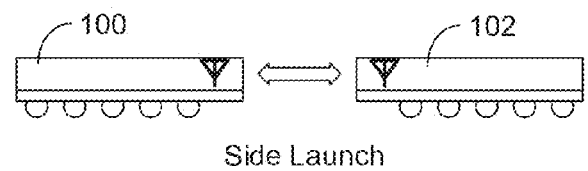
Figure 3D:
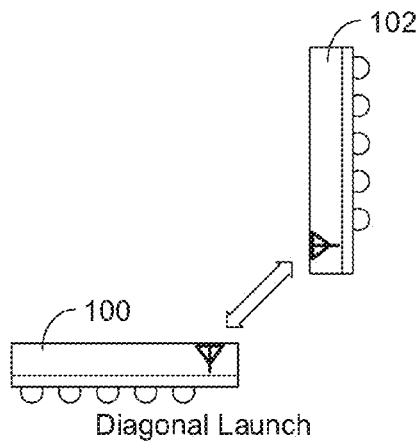

The EHF transceiver chips are configured to facilitate very short range wireless communication links between pairs of transceiver chips in various orientations. For example, a pair of chips may be configured with the top surfaces opposite one another as shown by the vertical launch configuration of FIG. 3a. As shown in FIG. 3b, the antennas of a pair of EHF transceiver chips do not need to be in alignment. FIG. 3c shows a configuration under which a pair of EHF transceiver chips 100 and 102 are in substantially the same plane. In addition to this configuration, a pair of EHF transceiver chips can be in respective parallel planes that are closely spaced (e.g., within a 5-15 millimeters). As shown in FIG. 3d, a diagonal launch configuration is also supported.

In accordance with further aspects of some embodiments, EHF transceiver chips are configured to support a plurality of very short length millimeter-wave wireless links between circuitry and components in physically separate enclosures, such as chassis employed in standard 19" racks. By way of example and without limitation, a configuration 400 is shown in FIGS. 4a and 4b under which circuitry on a server blade 402 in a blade server chassis 404 is linked in communication with a disk drive 406 in a storage array chassis 408. In further detail, server blade 402 includes a main board 410 to which an EHF transceiver chip 412 is mounted. As an option, an EHF transceiver chip may be mounted to a daughter board or otherwise comprise part of a multi-board module. In the illustrated embodiment of FIG. 4a, server blade 402 is either mounted within an enclosure including a cover plate 414 or is coupled to the cover plate 414 in which a hole 416 is formed. Similarly-sized holes 418 and 420 are respectively formed in the sheet metal baseplate 422 of blade server chassis 404 an in a top plate 424 of storage array 408. Preferably, holes 416, 418, and 420 are substantially aligned to form an open pathway 426 through cover plate 414, baseplate 422 and top plate 424, enabling transmission of RF energy between EHF transceiver chip 412 and an EHF transceiver 428 mounted to a backplane 430 in storage array chassis 408. Baseplate 430 includes a plurality of Serial ATA (SATA) connectors 432 to which disk drive 406 is connected.

In one embodiment, EHF transceiver chip 428 is configured to perform signaling to support a SATA interface to facilitate communication between disk drive 406 and the EHF transceiver chip using the SATA protocol. Accordingly, configuration 400 enables circuitry on server blade 410 to write data to and read data from a disk drive 406 in a separate chassis via an EHF millimeter-wave bi-directional wireless link 434. As a result, configuration 400 removes the need for use of physical cabling between blade server chassis 404 and storage array chassis 408.

Exemplary variations of configuration 400 are shown in FIGS. 4c, 4d, 4e, and 4f. Under a configuration 400c of FIG. 4c, a server blade 402a is mounted within an enclosure including a plastic cover plate 415 or otherwise cover plate 415 is attached to main board 410. Unlike metals, which generally attenuate RF signals in the EHF frequency range, various plastics may be employed that provide substantially insignificant attenuation. Accordingly, there is no hole formed in cover plate 415 in the illustrated embodiment. Alternatively, a hole could be formed in cover plate 415 depending on the attenuation of the cover plate material in the EHF frequency range.

Figures 4C, 4D:
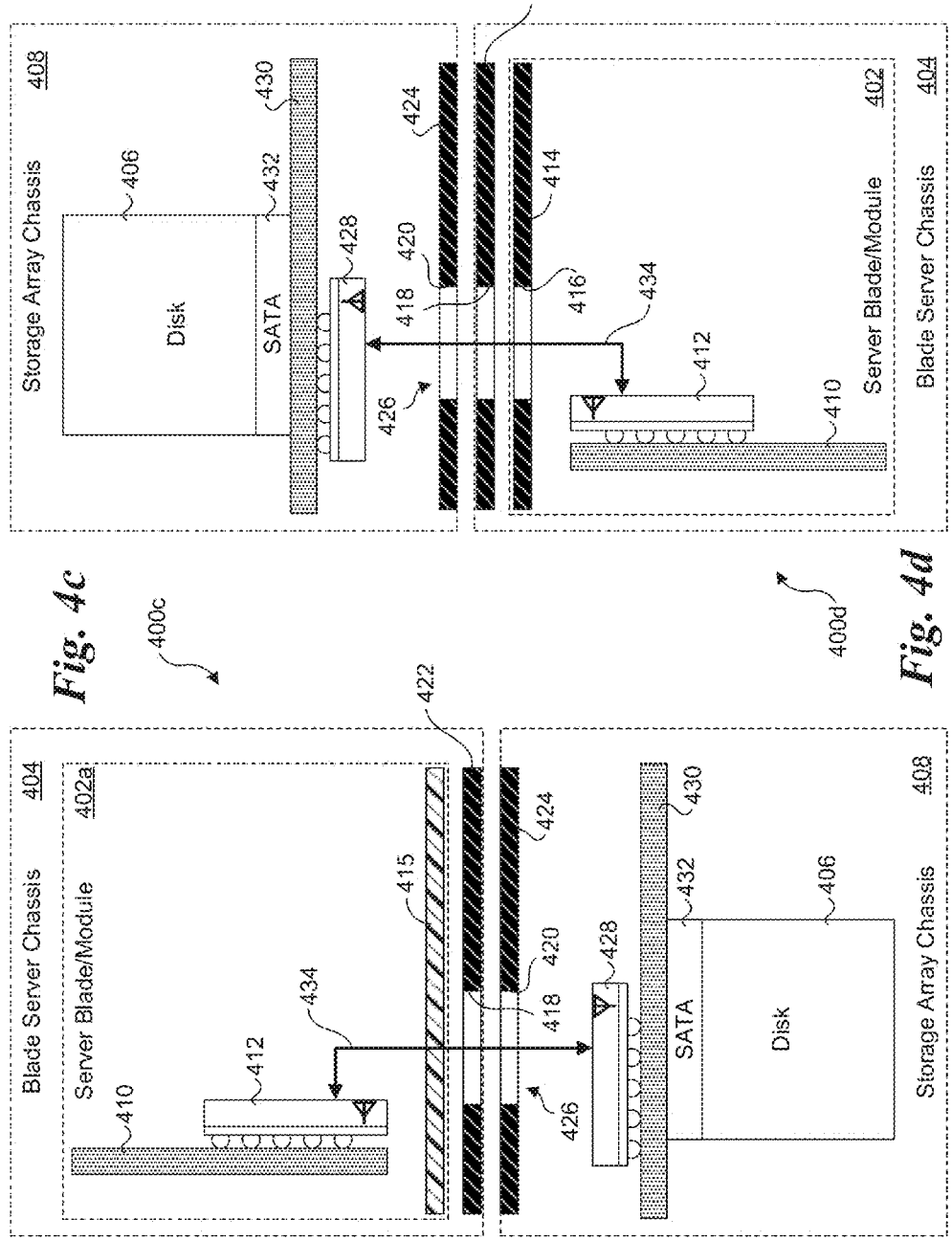
FIG. 4c illustrates a millimeter-wave wireless link between respective EHF transceiver chips in a blade server chassis above a storage array chassis under which signals are passed through holes in one plastic layer and two metal layers, according to one embodiment.
FIG. 4d illustrates a millimeter-wave wireless link between respective EHF transceiver chips in a storage array chassis above a blade server chassis under which signals are passed through holes in three metal layers, according to one embodiment.
Figure 4E:
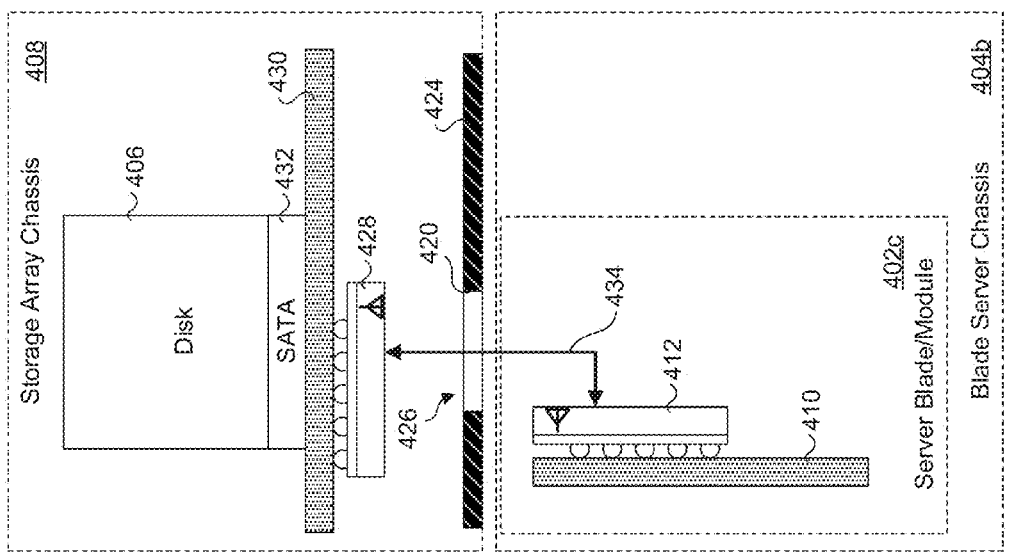
FIG. 4e illustrates a millimeter-wave wireless link between respective EHF transceiver chips in a storage array chassis above a blade server chassis under which signals are passed through holes in two metal layers, according to one embodiment.
Figure 4F:
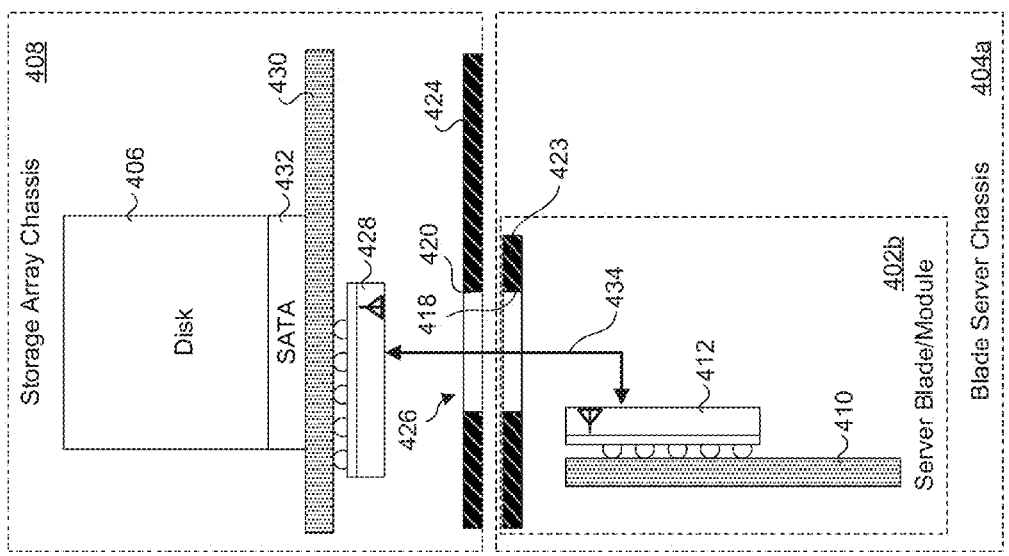
FIG. 4f illustrates a millimeter-wave wireless link between respective EHF transceiver chips in a storage array chassis above a blade server chassis under which signals are passed through a hole in one metal layer, according to one embodiment.

Under configurations 400d, 400e and 400f of respective FIGS. 4d, 4e, and 4f, the storage array chassis 408 is placed above blade server chassis 404, and the rest of the components are generally flipped vertically. Configuration 400d is similar to configuration 400, and includes the passing of EHF millimeter-wave bi-directional wireless link 434 via an open pathway formed by holes 416, 418, and 420 through cover plate 414, baseplate 422 and top plate 424.

Under some blade server chassis configuration, blade servers or server modules are inserted vertically and may be "hot-swapped" without having to power down the entire chassis. In addition, there are similar blade server chassis configurations under which the chassis does not include a top or cover plate, since this would need to be removed to remove or install server blades or modules. Such a configuration 400e is shown in FIG. 4e, wherein blade server chassis 404a does not include a cover plate. In this instance, RF signals to facilitate EHF millimeter-wave bi-directional wireless link 434 only need to pass through two metal sheets corresponding to base plate 424 of storage array chassis 408 and a cover plate 423 of a server blade 402b. The also reduces the distance between EHF transceiver chips 412 and 428.

Under configuration 400f shown in FIG. 4f, the RF signals only need to pass through a single metal sheet corresponding to the base plate 424 of storage array chassis 408. In this configuration, a blade server 402c does not include a cover plate. Optionally, the server blade or module could include a plastic cover plate (not shown) through which a hole may or may not be formed. As with blade server chassis 404a in FIG. 4e, blade server chassis 404b does not include a cover plate.

Figure 5F:
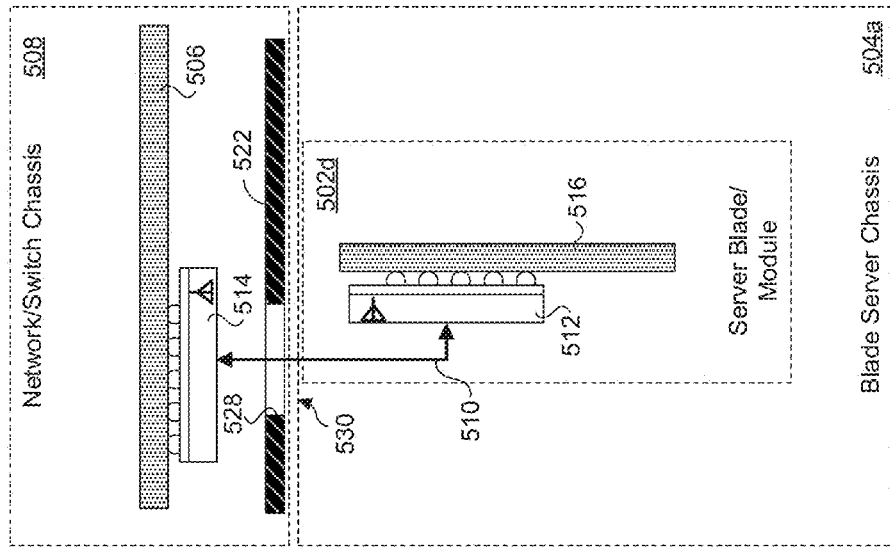
FIG. 5f illustrates a millimeter-wave wireless link between respective EHF transceiver chips in a network/switch chassis above a blade server chassis under which signals are passed through a hole in one metal layer, according to one embodiment.
Figure 5E:
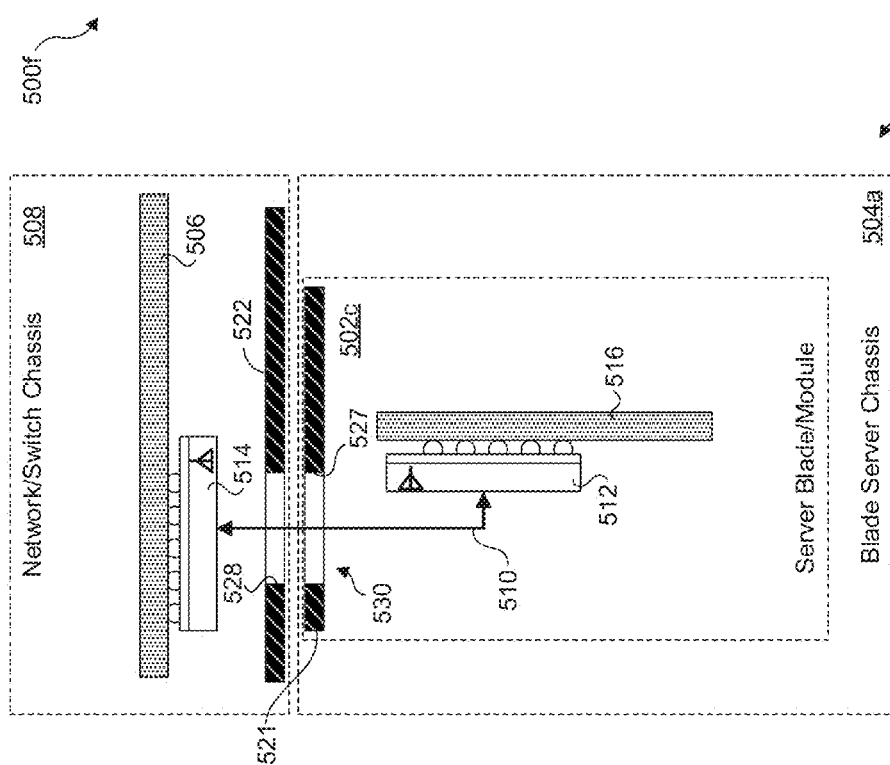
FIG. 5e illustrates a millimeter-wave wireless link between respective EHF transceiver chips in a network/switch chassis above a blade server chassis with an open top under which signals are passed through holes in two metal layers, according to one embodiment.

FIGS. 5a-5f illustrate various configurations under which server blades in a blade server chassis are enabled to wirelessly communicate with networking and/or switching components in a separate chassis. For example, FIGS. 5a and 5b illustrate a configuration 500 under which a server blade 502 in a blade server chassis 504 is enabled to communicate with networking circuitry on a backplane 506 in a network/switch chassis 508 via a an EHF millimeter-wave bi-directional wireless link 510 facilitated by a pair of EHF transceiver chips 512 and 514. As before, EHF transceiver chip 512 is mounted to a main board 516 (or daughterboard or similar) of server blade 502, which includes either an enclosure having a cover plate 518 or cover plate 518 is coupled to main board 516. The other two sheet metal layers illustrated in FIGS. 5a and 5b correspond to a blade server chassis cover plate 520 and a bottom plate 522 of network/switch chassis 508. Respective holes 524, 526, and 528 are formed in cover plate 518, cover plate 520, and bottom plate 522, thereby creating an open pathway 530 through which EHF millimeter-wave bi-directional wireless link 510 RF signals propagate.

Configuration 500c of FIG. 5c illustrates a server blade or module 502a that employs a plastic cover plate 519 rather than a metal cover plate. As above, depending on the attenuation of EHF RF signals by the plastic material, a hole through the cover plate may or may not need to be formed. Under a configuration 500d of FIG. 5d, server blade or module 502b does not employ a cover plate. Under a configuration 500e shown in FIG. 5e, blade server chassis 504a does not employ a cover plate, while server blade or module 502c employs a metal cover plate 521 with a hole 527 formed through it. Optionally, cover plate 521 could be made of plastic and may or may not include a hole (not shown). Under a configuration 500f of FIG. 5f, neither blade server chassis 504a nor server blade/module 502d employ a cover plate. Thus, the RF signals for EHF millimeter-wave bi-directional wireless link 510 only need to pass through a single metal sheet corresponding to bottom plate 522 of network/switch chassis 508.

As with any RF signal, the strength of the EHF millimeter-wave signal is a function of the RF energy emitted for the RF source (e.g., antenna) and the spectral attributes of the signal. In turn, the length of the wireless link facilitated between a pair of EHF transceiver chips will depend on the amount of RF energy received at the receiver's antenna and signal filtering and processing capabilities of the EHF receiver circuitry. In one embodiment, the aforementioned WCX100 chip supports multiple power output levels via corresponding control inputs via one or more of control pins 214. Under one embodiment, the distance between EHF transceiver chips is 2-15 mm, noting that this is merely exemplary and non-limiting. Generally, higher data transmission link bandwidth may be achieved when the link's pair of EHF transceiver chips are closer together and/or using more power.

To verify link performance capabilities and expectations under some of the embodiments disclosed herein, computer-based RF modeling was performed. Under one approach, the computational software (ANSYS HFSS) generated a visual representation of the signal strength of the RF signals emitted from a transmitting EHF transceiver chip. The models also considered the effect of the metal sheets/plates between pairs of EHF transceiver chips under various configurations.

Figure 6:
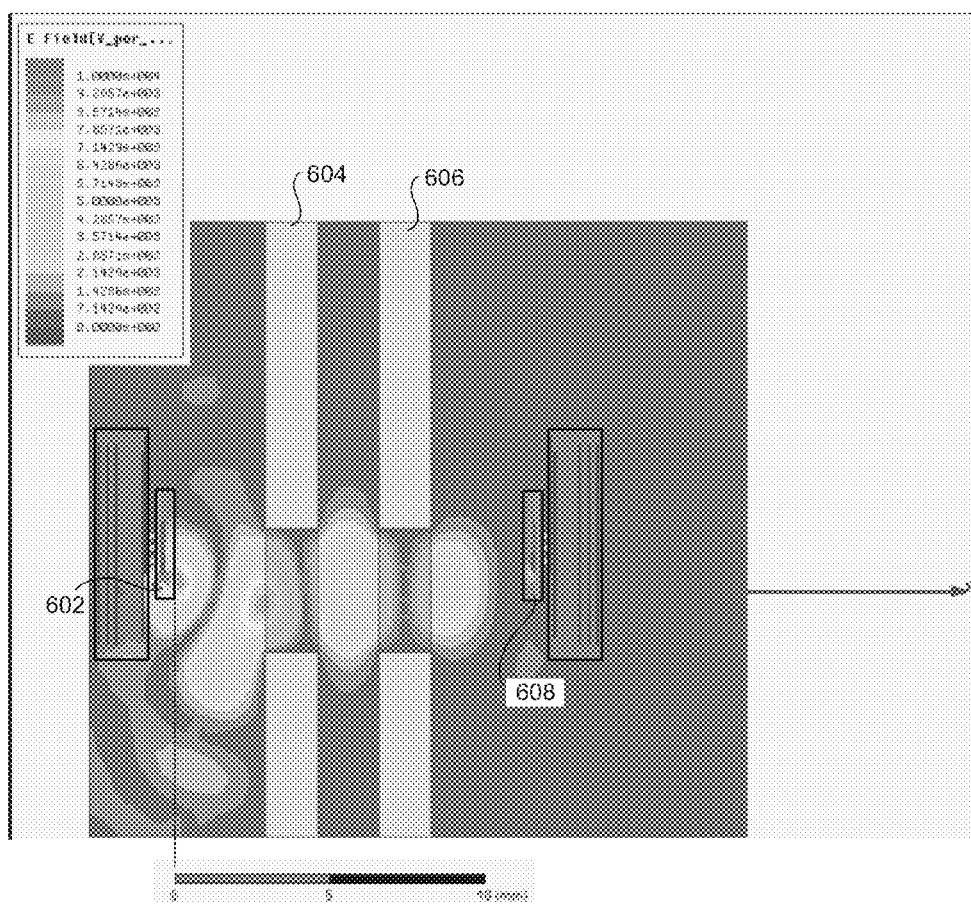
FIG. 6 is a graphic diagram depicting an electromagnetic field strength of signals emitted from a transmitting EHF transceiver chip and passing through holes in two metal layers using a vertical launch configuration.
Figure 7:
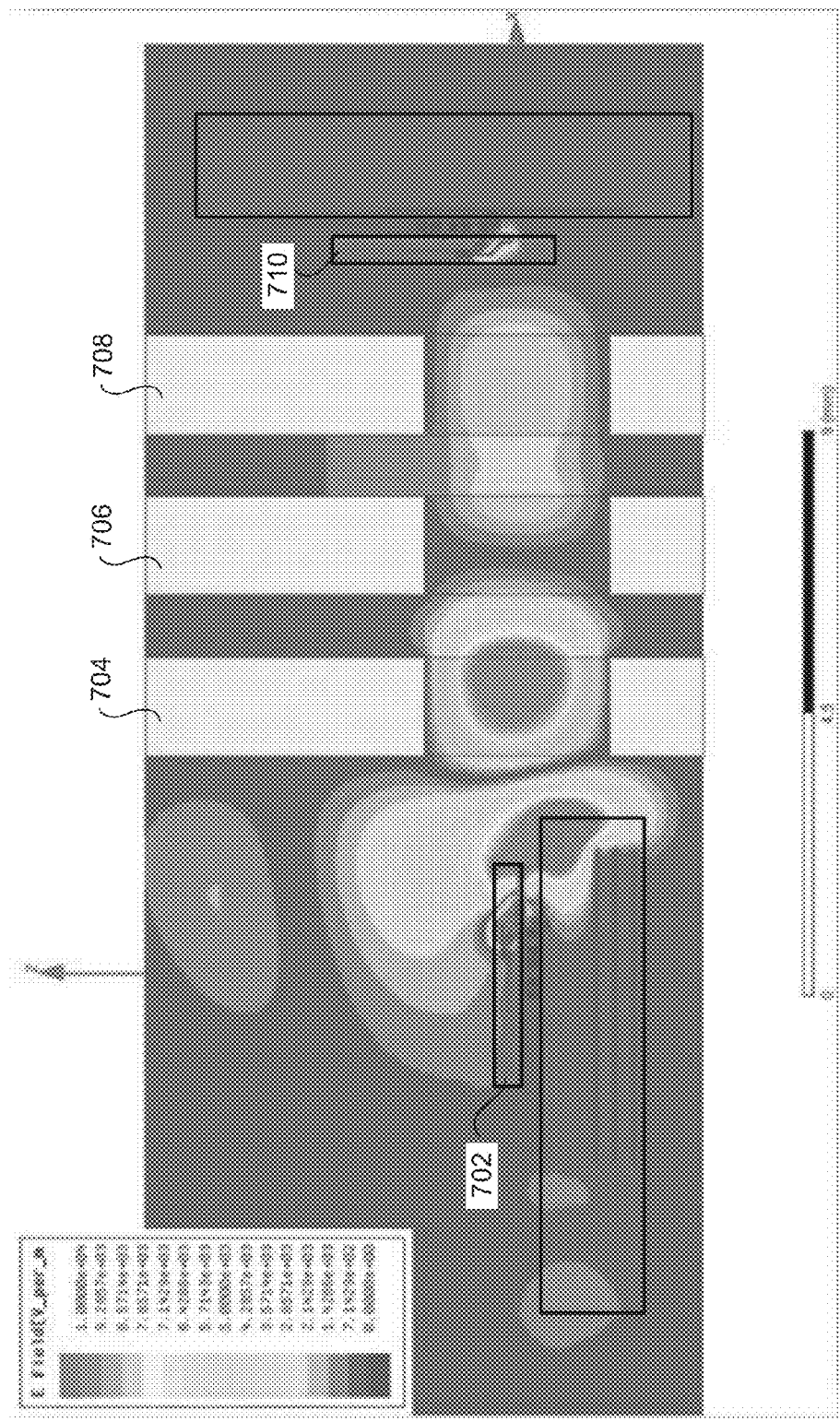
FIG. 7 is a graphic diagram depicting an electromagnetic field strength of signals emitted from a transmitting EHF transceiver chip and passing through holes in three metal layers using a diagonal launch configuration.

A snapshot 600 of the RF energy pattern for a configuration under which the RF signal emitted from a transmitting EHF transceiver chip 602 is modeled as passing through two metal sheets 604 and 606 before being received by a receiving EHF transceiver chip 608 is shown in FIG. 6. The model graphically illustrates the electro-magnetic field energy level in decibels. FIG. 7 shows a snapshot 700 of the RF energy pattern for a configuration under which the RF signal emitted from a transmitting EHF transceiver chip 702 is modeled as passing through three metal sheets 704, 706 and 708 before being received by a receiving EHF transceiver chip 710. In addition to these configurations, various other configurations were modeled, including variations in the size of the holes in the metal sheets/plates, the number of metal sheets/plates, the distance between the pair of EHF transceiver chips, the orientation of the EHF transceiver chips (e.g., vertical launch, side launch, diagonal launch, amount of alignment offset, etc.).

Generally, the teachings and principles disclosed herein may be implemented to support wireless communication between components in separate chassis that are adjacent to one another (e.g., one chassis on top of another chassis in the rack). Various non-limiting examples of configurations supporting wireless communication between chassis using EHF transceiver chips are shown in FIGS. 8a, 8b, 9a, 9b, 10a, 10b, 11a, 11b, 12a, 12b, 13a, 13b, 14a, and 14b. It will be understood that the configurations shown in these figures are simplified to emphasize the millimeter-wave wireless communication facilitated through use of EHF transceiver chips. Accordingly, these illustrative embodiments may show more or less EHF transceiver chips than might be implemented, and actual implementations would include well-known components that are not shown for convenience and simplicity in order to not obscure the inventive aspects depicted in the corresponding Figures. In addition, the illustrated embodiment may not be to scale, and may present partial or transparent components to reveal other components that would otherwise be obscured.

Figure 8B:
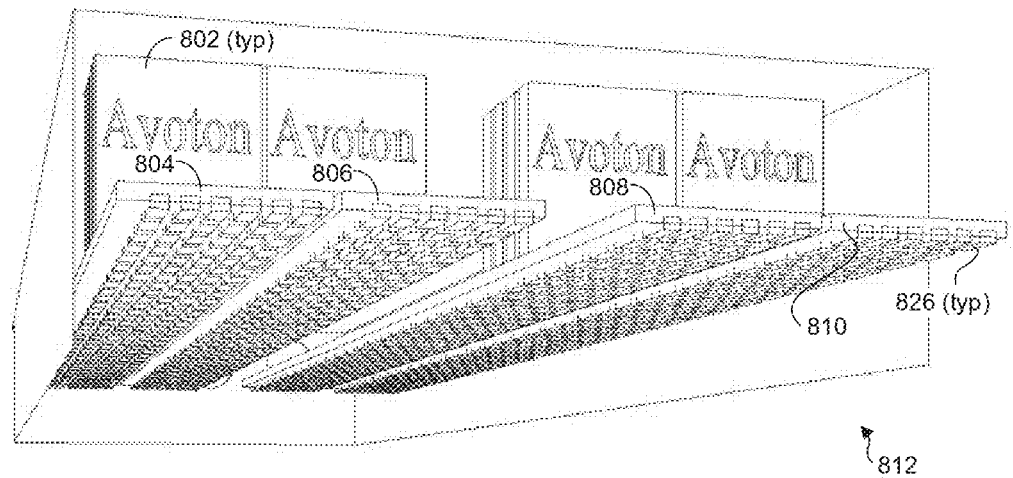
Figure 8B:
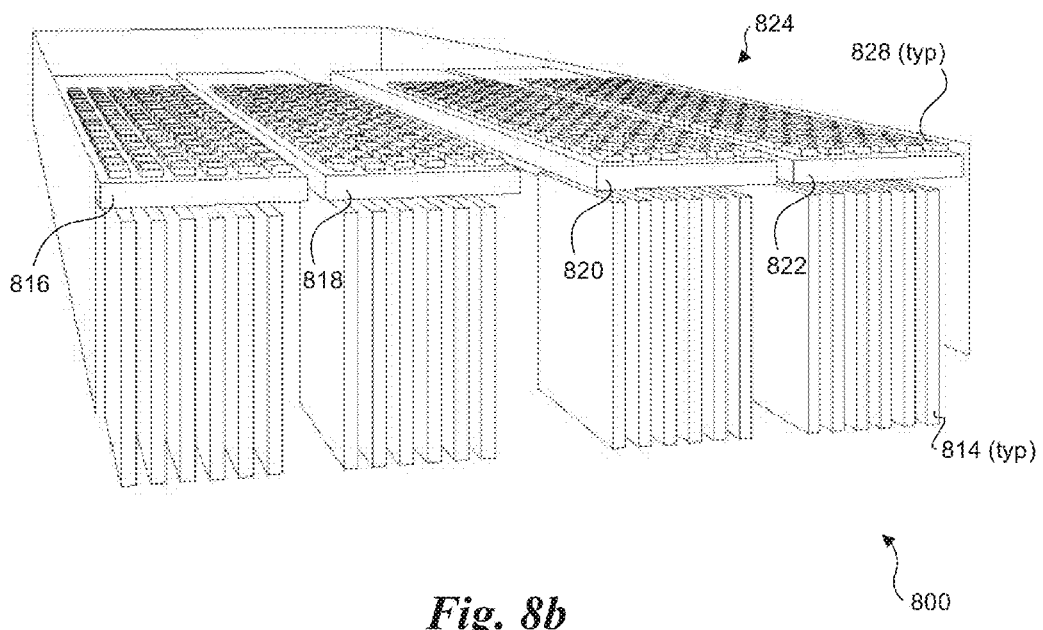

In a configuration 800 of FIGS. 8a and 8b, an array of server modules 802 are mounted to backplanes 804, 806, 808, and 810 in an upper server chassis 812. In one exemplary embodiment, server modules 802 comprising Intel® Avoton™ servers modules. Meanwhile, a plurality of storage drives 814 are coupled to backplanes 816, 818, 820, and 822 in a lower storage chassis 824. Each of backplanes 804, 806, 808, and 810 contain an array of downward-facing EHF transceiver chips 826, while each of backplanes 816, 818, 820, and 822 contain an array of upward-facing EHF transceiver chips 828, wherein the arrays of the EHF transceiver chips are configured such that the downward-facing EHF transceiver chips are aligned respective upward-facing EHF transceiver chips on a pairwise basis. In addition to what is shown in FIGS. 8a and 8b, there would be arrays of holes (not shown) in a bottom 830 of upper chassis 812 and a cover plate (not shown) of lower storage chassis 824.

Figure 9A:
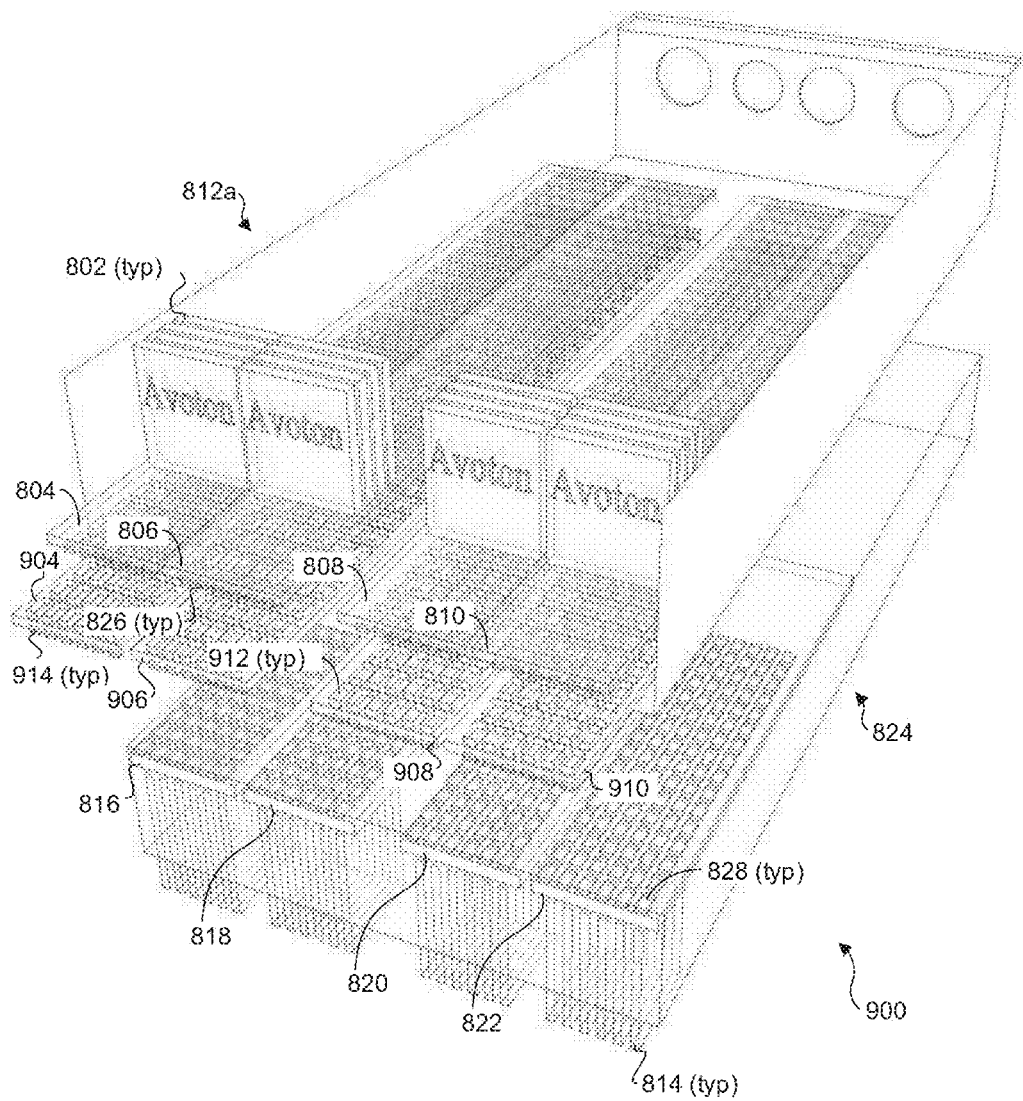
FIGS. 9a and 9b illustrated a modified version of the configuration of FIGS. 8a and 9b further adding four fabric backplanes with EHF transceiver chips on both sides in the server chassis, according to one embodiment.
Figure 9B:
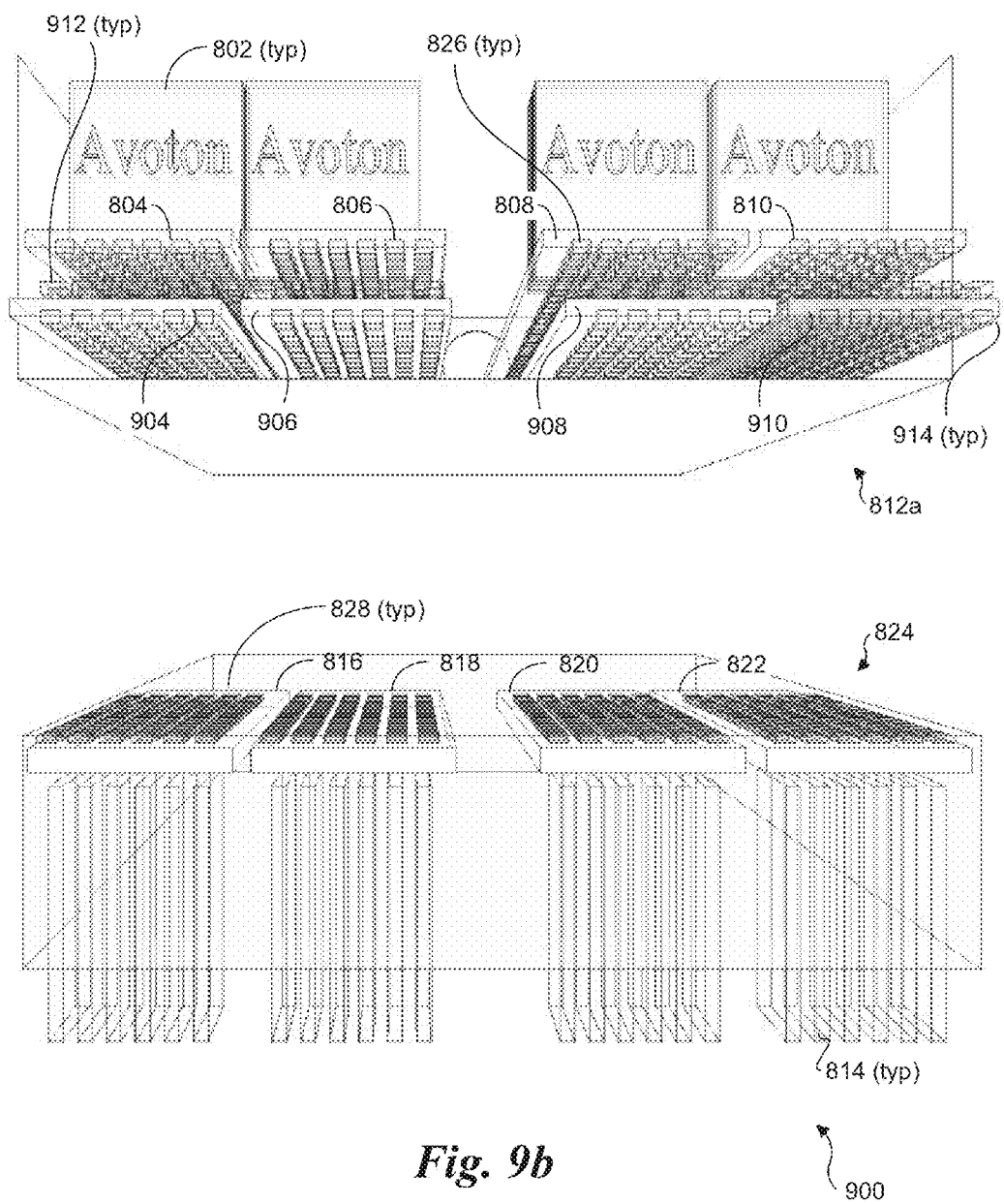

FIGS. 9a and 9b show a configuration 1000 under which a server chassis 812a comprising a modified version of server 812 is installed above a storage chassis 824. As illustrated, server chassis 812 now further includes four fabric backplanes 904, 906, 908 and 910 disposed below backplanes 804, 806, 808, and 810. Each of fabric backplanes 904, 906, 908 and 910 includes an array of upward-facing EHF transceiver chips 912 mounted to its topside an array of downward-facing EHF transceiver chips 914 mounted to its underside. Upward-facing EHF transceiver chips 828 are configured to be substantially aligned with downward-facing transceiver chips 826 on backplanes 804, 806, 808, and 810. Similarly, downward-facing EHF transceiver chips 914 are configured to be substantially aligned with upward-facing transceiver chips on 828 on backplanes 816, 818, 820, and 822.

Figure 10A:
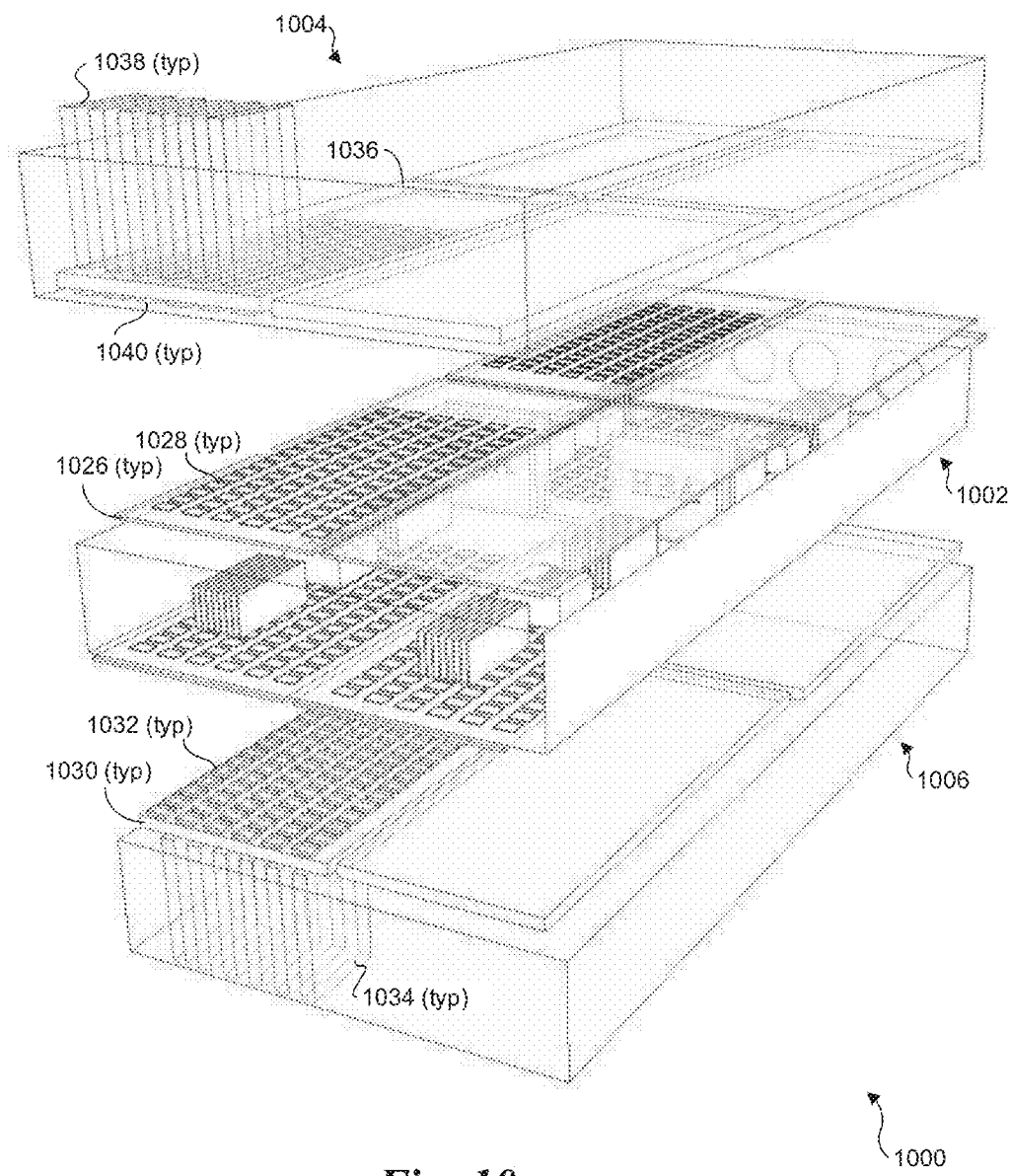
FIGS. 10a and 10b illustrate a configuration under which components in a middle server chassis are enabled to wirelessly communicate with components in storage chassis above and below the server chassis, according to one embodiment.
Figure 10B:
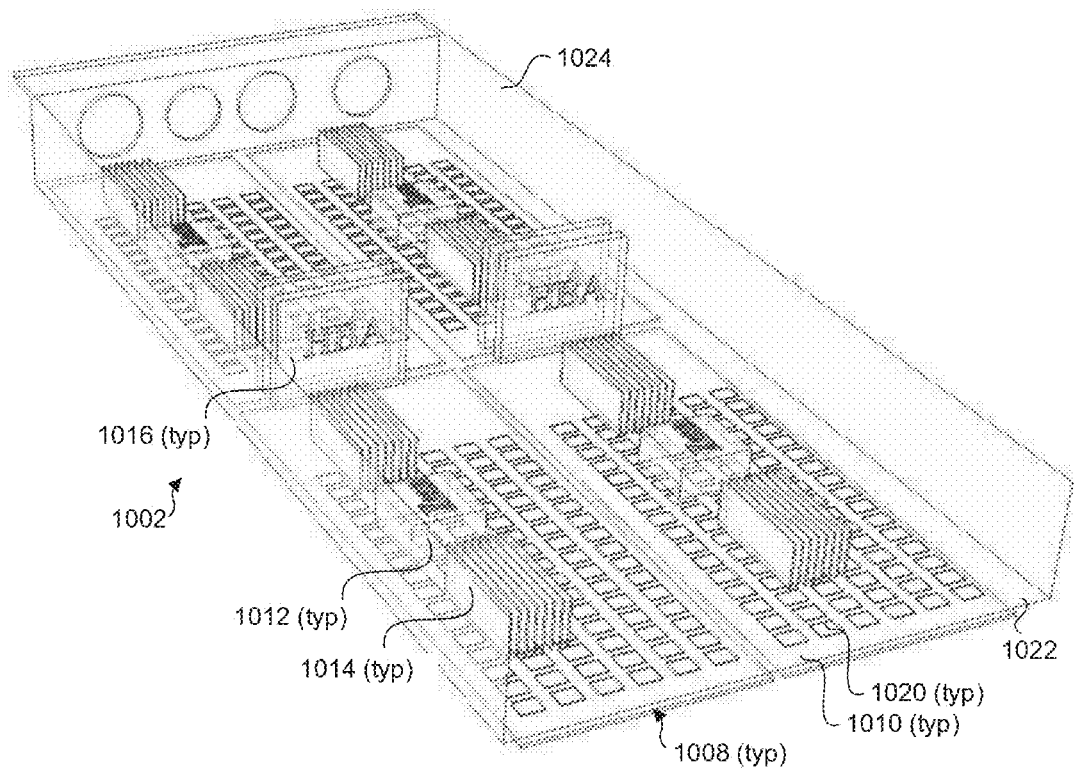

FIG. 10a shows a configuration 1000 under which a middle server chassis 1002 is sandwiched between an upper storage chassis 1004 and a lower storage chassis 1006, with further details of middle server chassis 1002 depicted in FIG. 10b. Server chassis 1002 includes server board assemblies 1026, each including a backplane 1010 to which various components are mounted on a topside thereof including a processor 1012, a plurality of memory modules 1014, and an InfiniBand host bus adaptor (HBA) 1016. Processor 1012 is generally illustrative of one or more processors that may be included with each server board assembly 1008. An array of EHF transceiver chips 1020 are mounted to the underside of each backplane 1010. In addition, there would be a hole pattern having a configuration similar to the EHF transceiver chips 1020 in the base plate 1022 of a chassis frame 1024 (not shown for clarity).

As shown in FIG. 10a, server chassis 1002 also includes an upper set of four backplanes 1026, each including an array of upward-facing EHF transceiver chips 1028. In one embodiment, backplanes 1026 are communicatively coupled to backplanes 1010 via some form of physical connections, such as but not limited to connectors between pairs of backplanes or ribbon cables. In the illustrated embodiments, pairs of upper and lower backplanes are each connected to an HBA 1016 that further supports communication between the backplanes.

Lower storage chassis 1006 is generally configured in a similar manner to lower storage chassis 824, except the shape of each of four backplanes 1030 is different than backplanes 816, 818, 820, and 822. As before, an array of upward-facing EHF transceiver chips 1032 is mounted to each backplane 1030, while a plurality of storage drives 1034 are coupled to an underneath side of the backplanes via applicable connectors. There also would be an array of holes in the cover plate of lower storage chassis 1006 (not shown) that would be aligned with the array of EHF transceiver chips 1032.

Upper storage chassis 1004 is generally configured in a similar manner to lower storage chassis 1006, but with its vertical orientation flipped. As a result, each of four backplanes 1036 include a plurality of storage devices 1038 coupled to its topside, and an array of downward-facing EHF transceiver chips 1040. Upper storage chassis 1004 would also have an array of storage drives 1038.

Figure 11A:
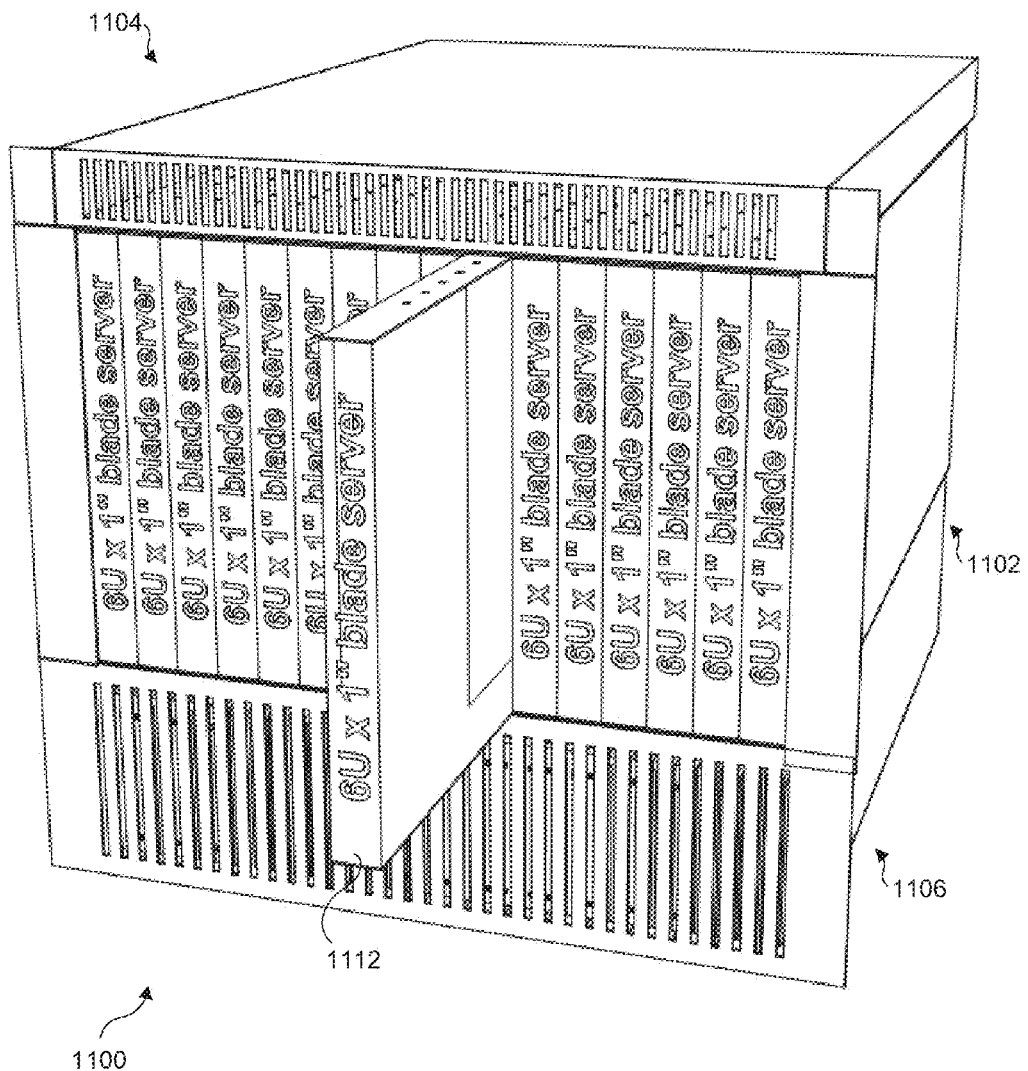
FIGS. 11a and 11b illustrate a configuration under which a 6 U server chassis is disposed below a network/switch chassis and above a storage array, according to one embodiment.
Figure 11B:
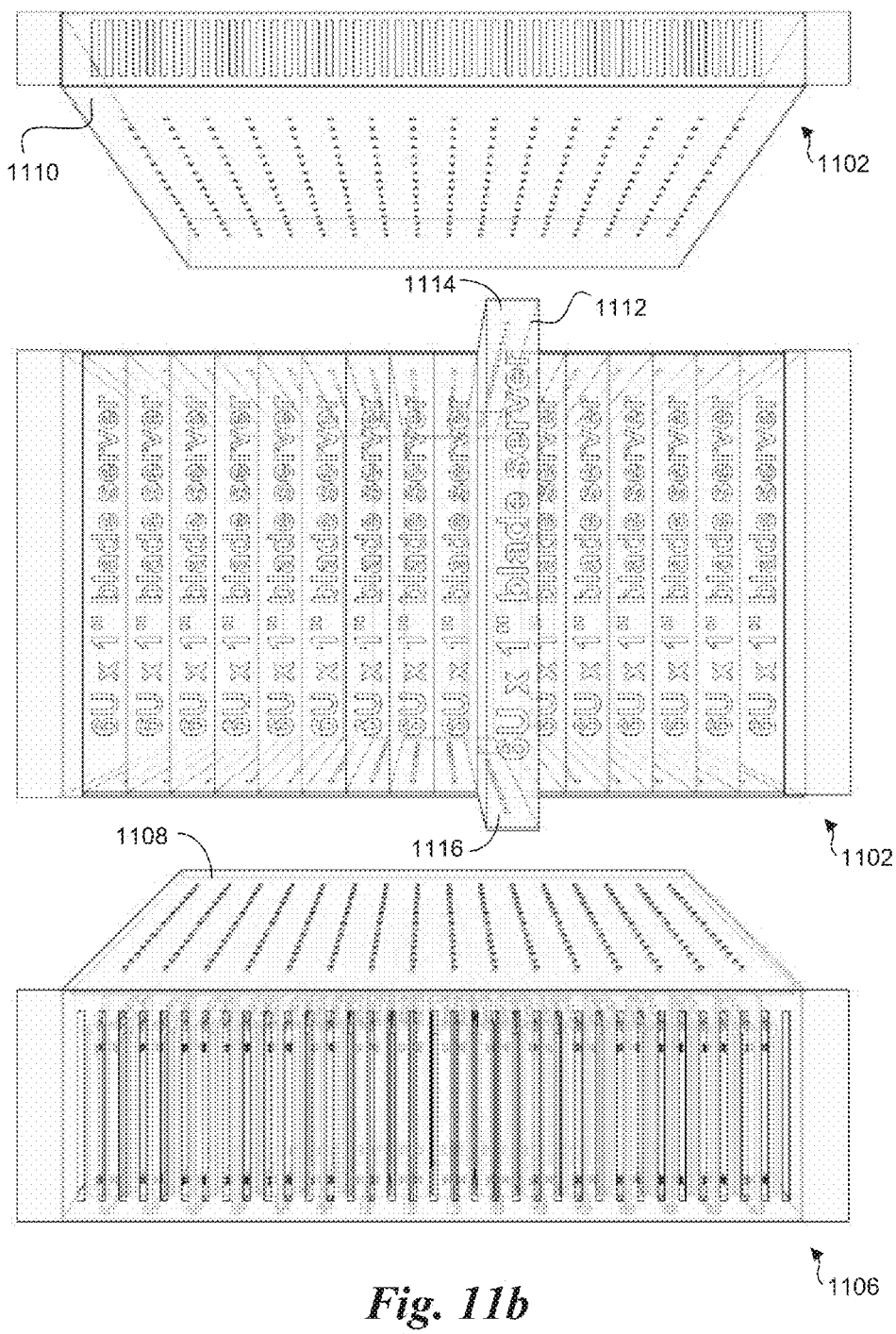

FIGS. 11a and 11b illustrate a configuration 1100 including a 6 U blade server chassis 1102 disposed under a switch chassis 1104 and above a storage array 1006. As shown in FIG. 11b, arrays of holes are formed in a cover plate 1108 of storage array 1006 and in a base plate 1110 of switch chassis 1004. Each of a plurality of server blades 1112 installed in blade server chassis 1102 includes a frame having an upper plate 1114 and a lower plate 1116 through which a plurality of holes are formed adjacent to EHF transceiver chips along the top and bottom edges of the server blade's main board (not shown), which is mounted to the frame. In addition, the cover and base plate of blade server chassis 1102 (not shown) will also include a plurality of holes that are substantially aligned with the holes in upper plate 1114 and lower plate 1116 when blade servers 1112 are installed in server chassis 1002.

Figure 12A:
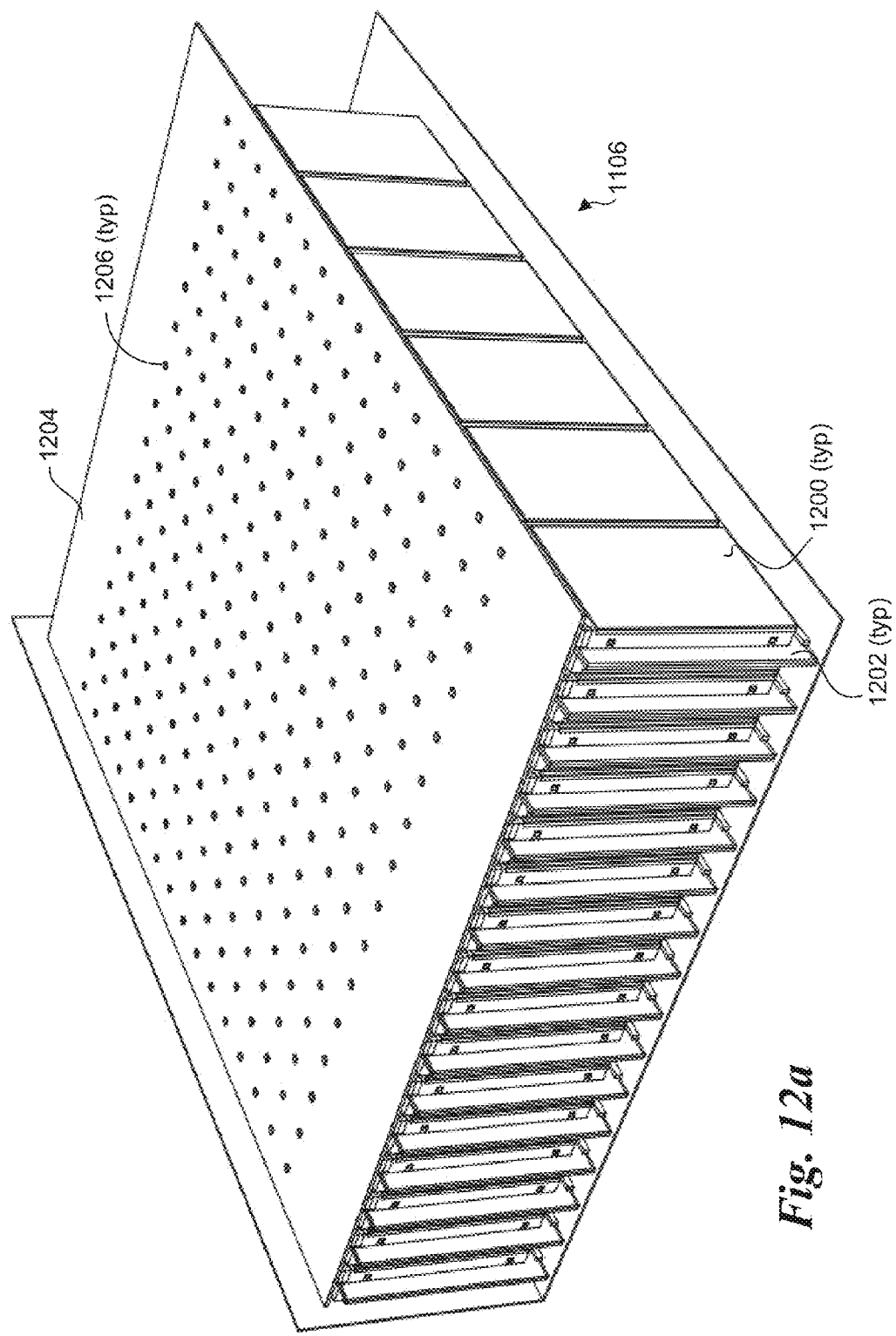
FIGS. 12a and 12b respective show topside and underside isometric perspective views of a storage array employing an upper backplane including an array of EHF transceiver chips, according to one embodiment.
Figure 12B:
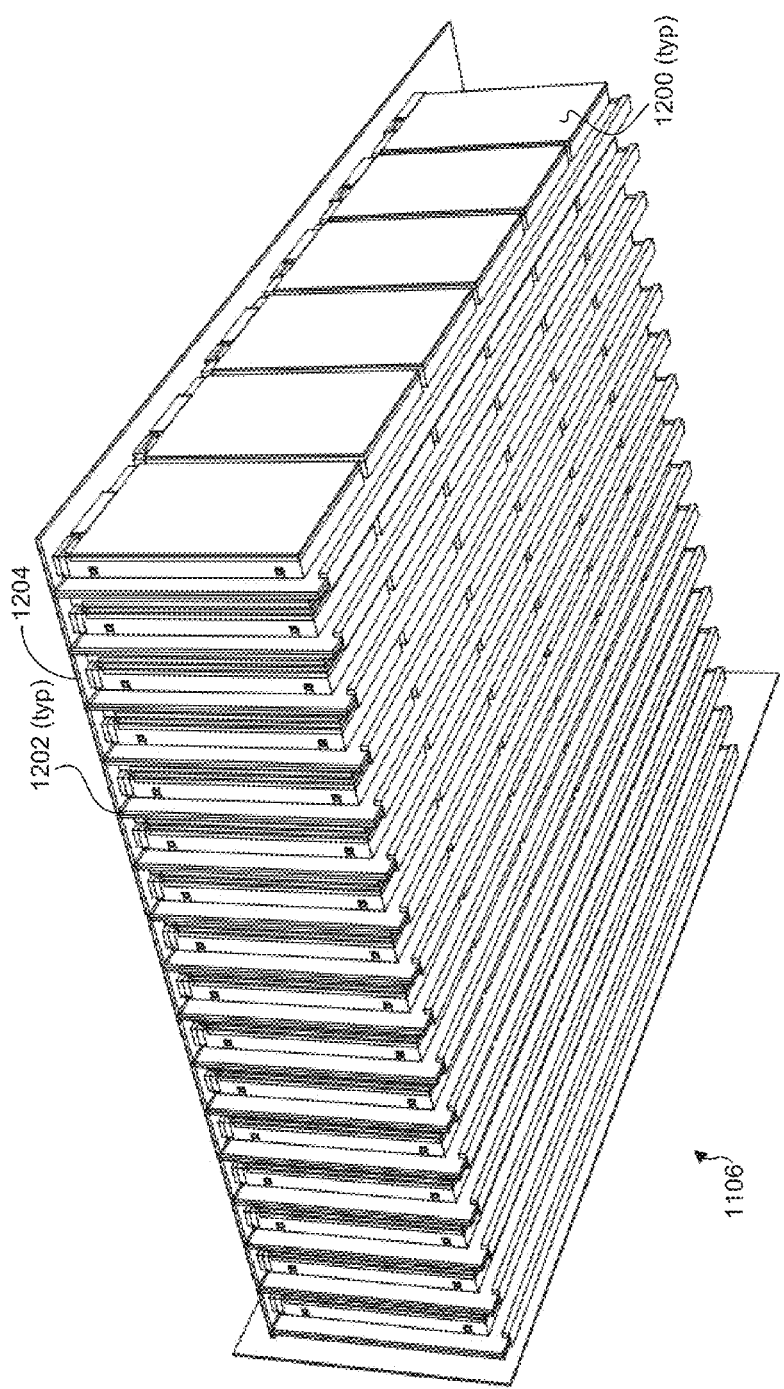

FIGS. 12a and 12b show further details of storage array 1106, according to one embodiment. A plurality of storage drives 1200 are mounted to and communicatively coupled with (e.g., via SATA connectors) vertical boards 1202. In turn, the vertical boards 1202 are communicatively coupled with a backplane 1204 including an array of EHF transceiver chip 1206. In the illustrated embodiment, storage drives comprise 2½ inch drives that are mounted back to back. Storage drives having other form factors, such as 3½ inch drives may be used in other embodiments.

Figure 12C:
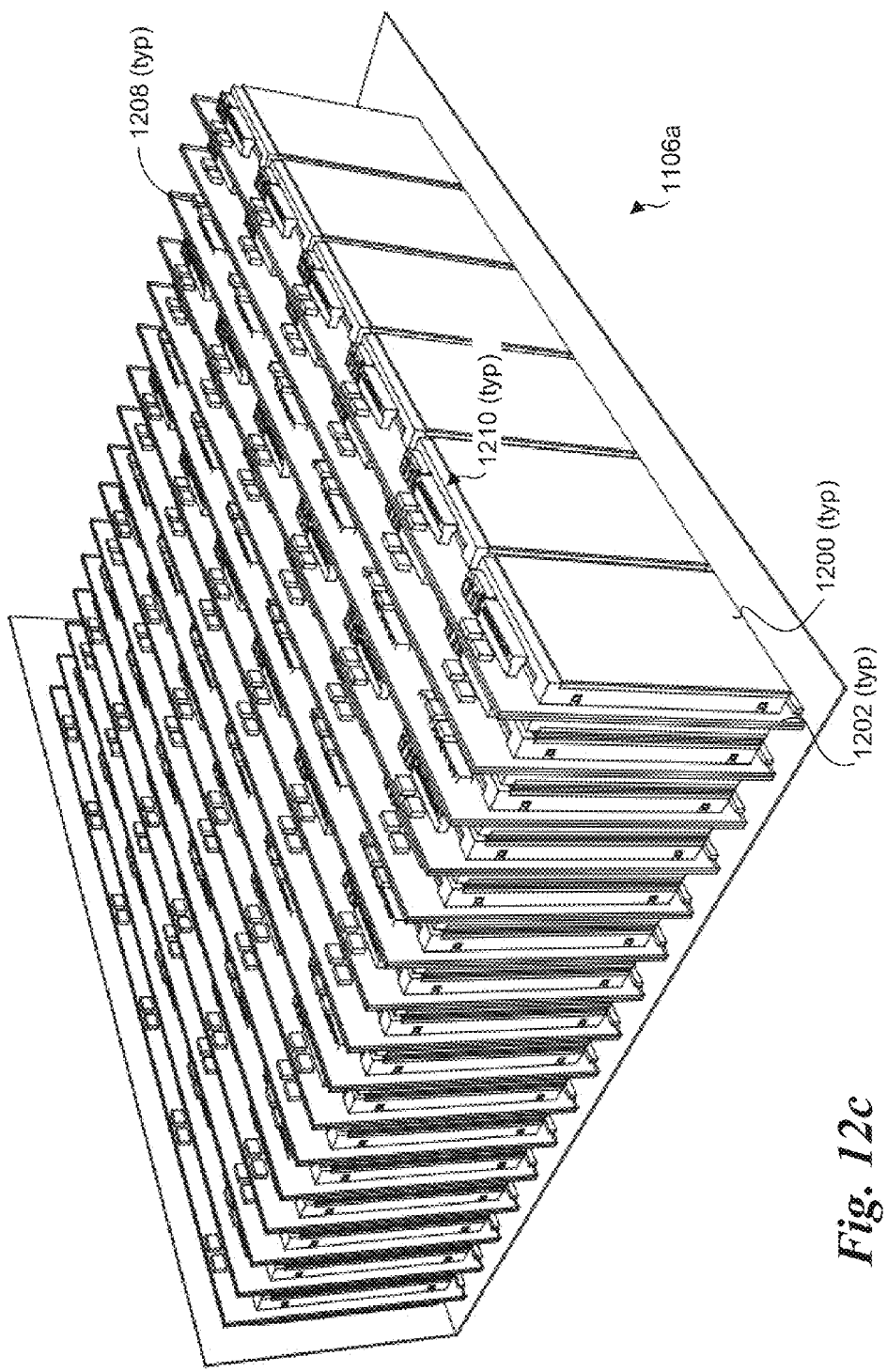
FIG. 12c shows a topside isometric perspective view of a storage array employing EHF transceiver chips mounted to vertical boards to which storage drives are coupled, according to one embodiment.

FIG. 12c shows an embodiment of a storage array 1106a. Under the illustrated configuration, EHF transceiver chips 1208 are mounted toward the top of vertical boards 1202. In the illustrated embodiment one EHF transceiver chip 1208 is implemented for each drive; however, this is merely exemplary, as multiple EHF transceiver chips may be used for one or more drive. Also in the illustrated embodiment the EHF transceiver chips 1208 are mounted on a single side of vertical boards 1202; optionally, EHF transceiver chips may be mounted on both sides of the vertical boards.

Figure 12D:
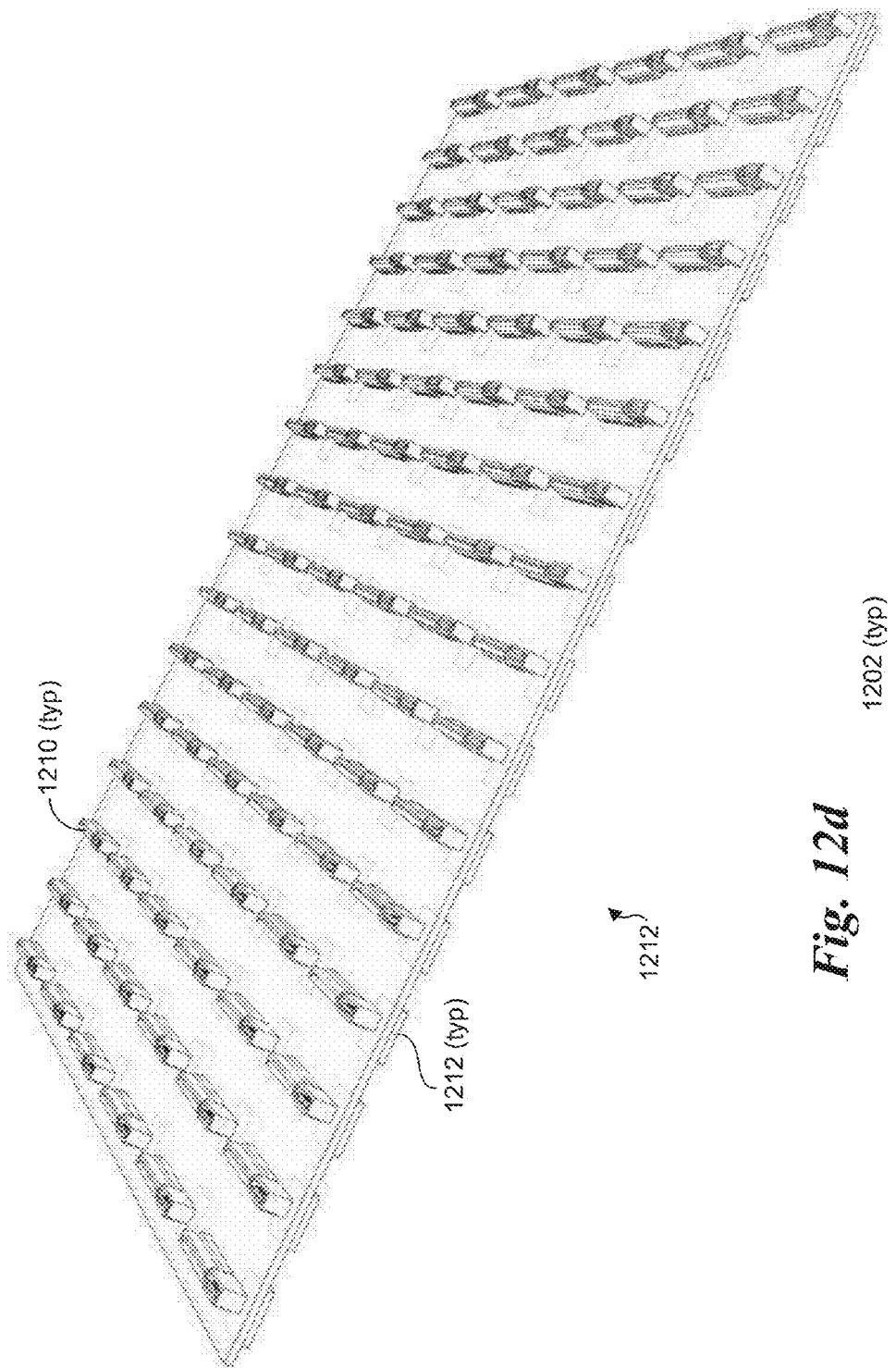
FIG. 12d illustrates a backplane configured for use in a storage array including an array of SATA connectors on its topside and an array of EHF transceiver chips on its underside.
Figure 13A:
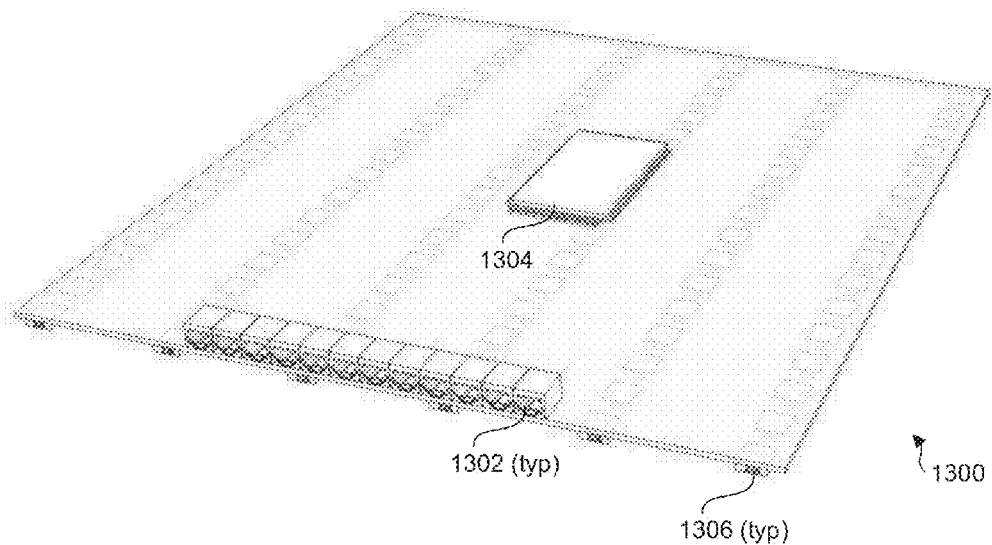
FIGS. 13a and 13b illustrate a backplane configured for use in a network/switch chassis, according to one embodiment.
Figure 13B:
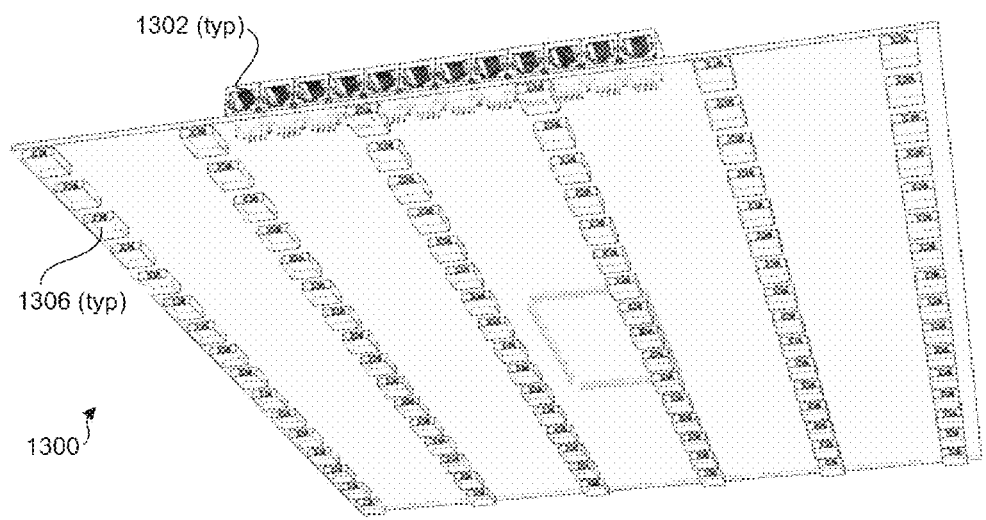

As shown in FIG. 12d, in one embodiment a plurality of SATA connectors 1210 are mounted to a backplane 1212 having an array of EHF transceiver chips 1214. In one configuration, backplane 1212 is disposed in the bottom of a chassis with SATA connectors 1210 pointing upward and EHF transceiver chips 1214 pointing downward. In another configuration, backplane 1212 is inverted and disposed toward the top of a chassis with EHF transceiver chips 1214 pointing upward and SATA connectors 1210 pointing downward.

EHF transceiver chips may be implemented in networking related chassis, such as switch chassis and network chassis or a network/switch chassis that includes components supporting networking and switching functions. Generally, a network/switch chassis may employ a single backplane or two backplanes arrayed with EHF transceiver chips, such as illustrated by a network/switch backplane 1300 in FIGS. 13a and 13b. In this example, a plurality of Ethernet network connectors 1302 comprising RJ45 Ethernet jacks are mounted on a topside of network/switch backplane 1300, while an array of EHF transceiver chips 1304 are mounted on the underside of the backplane. Wire traces in network/switch backplane 1300 are routed to network connectors 1302 and a multi-port network/switch chip 1304. Although only a single multi-port network/switch chip is shown, it will be understood that multiple chips of similar configuration may be implemented on a network/switch backplane, and that network ports and switch operations may also be implemented on separate chips or otherwise using separate circuitry and logic. Multi-port network/switch chip 1304 also is connected via wire traces in network/switch backplane 1300 to EHF transceiver chips 1306. In addition, applicable interface circuitry and signal-conditioning circuitry (not shown) may be implemented using techniques and principles well-known in the art.

The terminology network/switch is meant to convey the apparatus may be implemented for networking and switching functions. Depending on the particular system needs or architecture, a network/switch chassis may include various numbers of external network ports that are used to interface with other servers, storage devices, etc. in other chassis and/or other racks, such as 4, 8 12, 16, 24, etc. In some implementations, a network/switch backplane may be configured to support switching functionality related to internal communications in a manner similar to some switch cards used in data centers and the like.

Figure 14A:
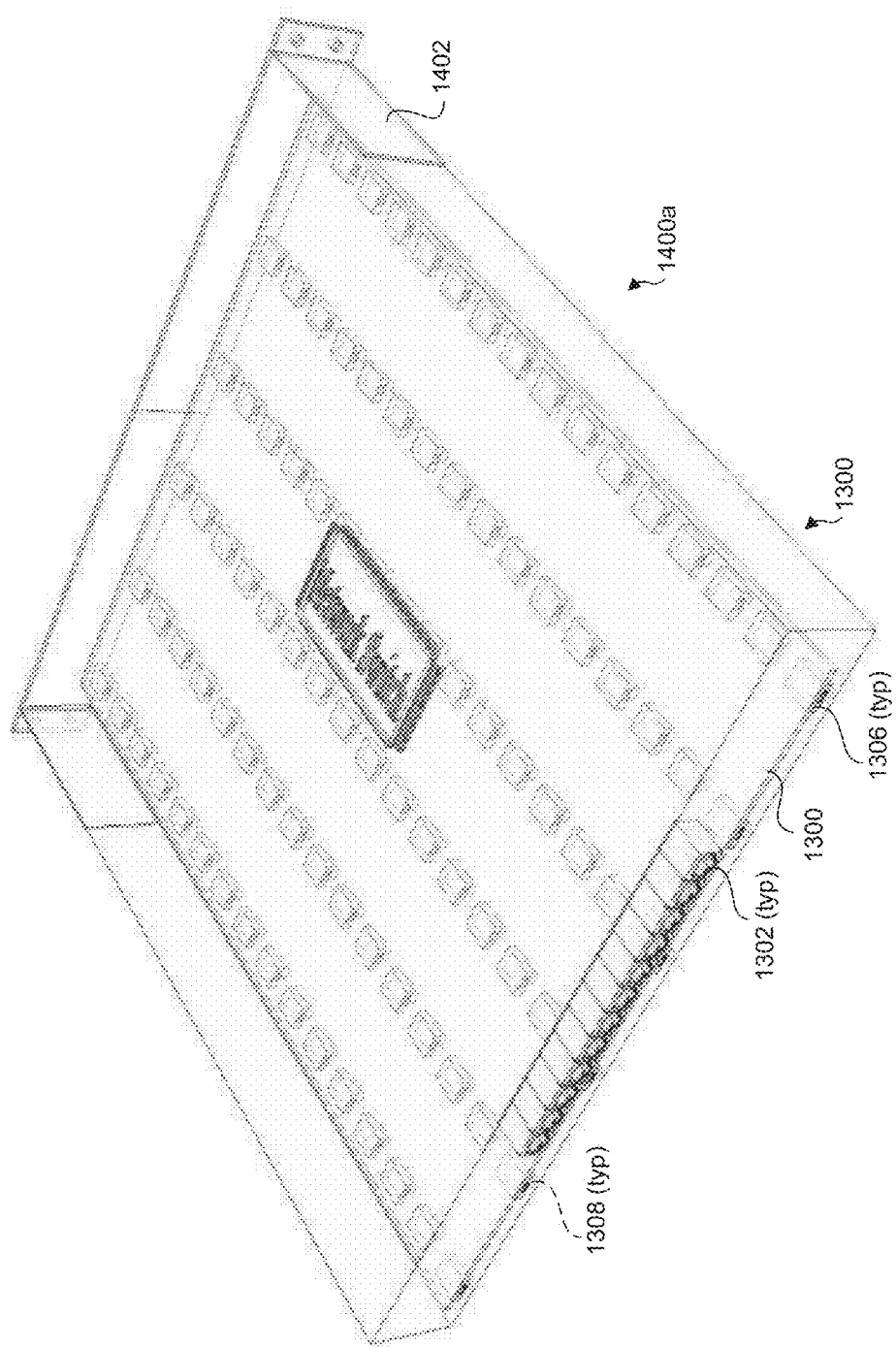
FIG. 14a shows a network switch chassis implementing the backplane of FIGS. 13a and 13b.
Figure 14B:
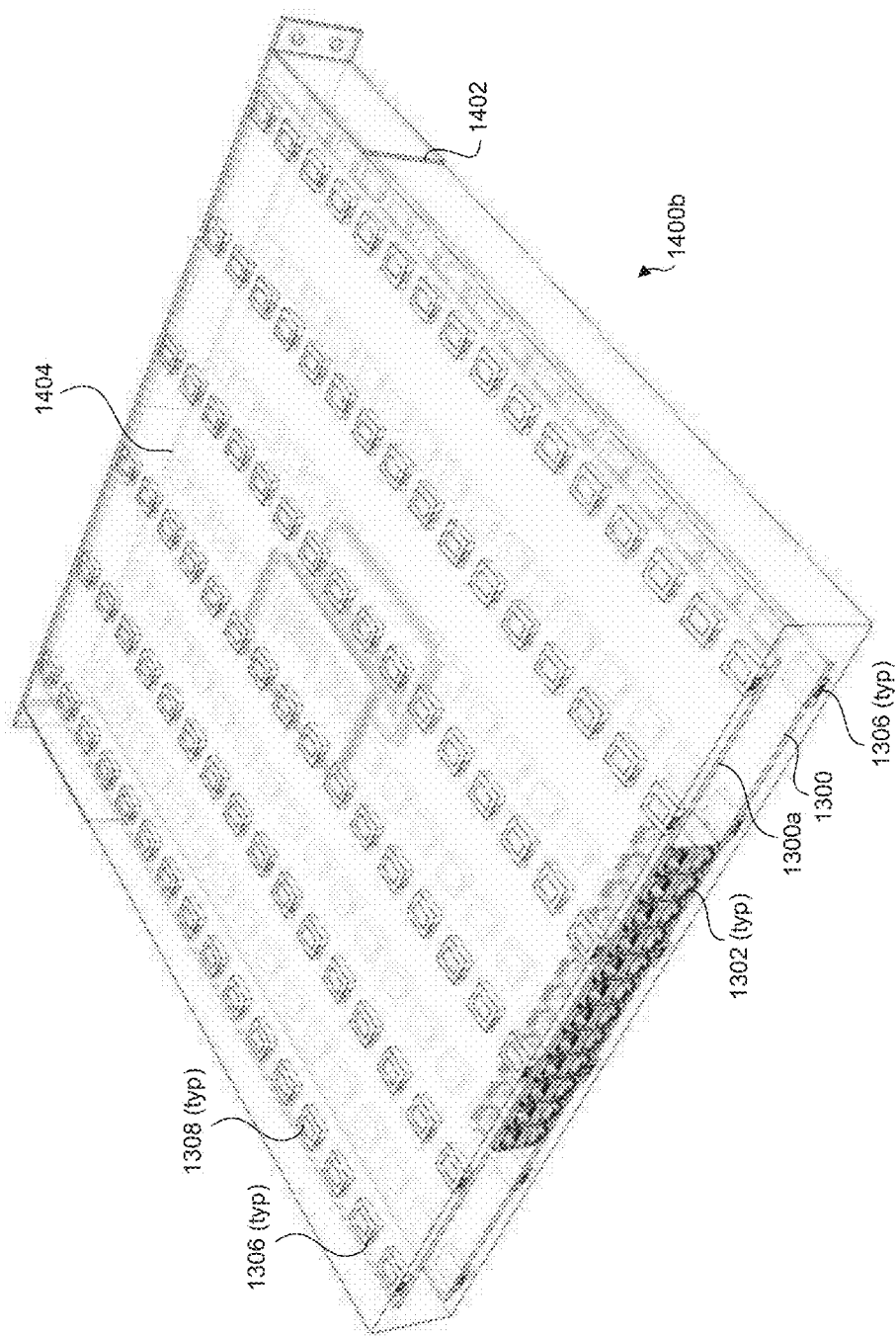
FIG. 14b shows a network switch chassis implementing two backplanes of FIGS. 13a and 13b under which the upper backplane is inverted.

FIGS. 14a and 14b respectively show exemplary 1 U network/switch chassis that support wireless connections with a chassis below (for network/switch chassis 1400a) and with both a chassis above and below (for a network/switch chassis 1400b). As shown in FIG. 14a, a network/switch backplane 1300 is mounted within a 1 U chassis frame 1402, with network connectors 1302 mounted toward the rear of the chassis frame. Network/switch chassis 1400b further adds a second network/switch backplane 1300a this is mounted such that EHF transceiver chips 1404 are just below a top) of 1 U chassis frame 1402 in which a plurality of holes 1308 are defined proximate to each EHF transceiver chip.

Figure 15:
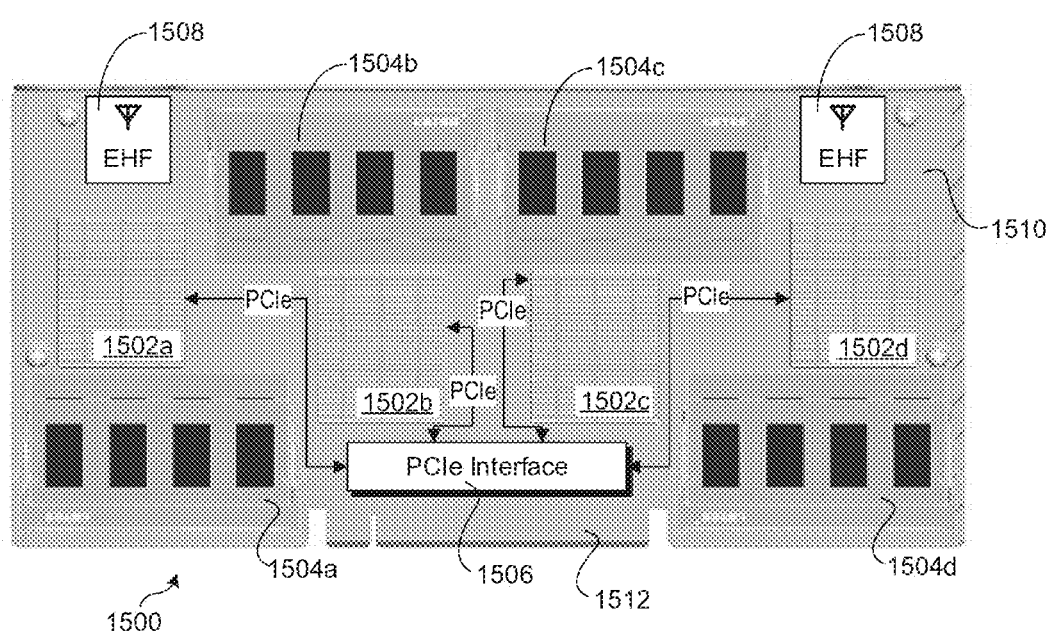
FIG. 15 illustrates a server module including a pair of EHF transceiver chips mounted to its main PCB board, according to one embodiment.

A server module 1500 configured to facilitate wireless communication with components in another chassis is shown in FIG. 15. Server module 1500 includes four CPU subsystems comprising Systems on a Chip (SoCs) 1502a, 1502b, 1502c, and 1502d, each coupled to respective memories 1504a, 1504b, 1504c, and 1504d. Each of SoCs 1502a, 1502b, 1502c, and 1502d is also communicatively coupled to PCIe interface 1506 via a respective PCIe link. Each of SoCs 1502a, 1502b, 1502c, and 1502d also has access to an instruction storage device that contains instructions used to execute on the processing cores of the SoC. Generally, these instructions may include both firmware and software instructions, and may be stored in either single devices for a module, or each SoC may have its own local firmware storage device and/or local software storage device. As another option, software instructions may be stored on one or more mass storage modules and accessed via an internal network during module initialization and/or ongoing operations.

Each of the illustrated components are mounted either directly or via an applicable socket or connector to a printed circuit board (PCB) 1510 including wiring (e.g., layout traces and vias) facilitating transfer of signals between the components. This wiring includes signal paths for facilitating communication over each of the PCIe links depicted in FIG. 15. PCB 1510 also includes wiring for connecting selected components to corresponding pin traces on an edge connector 1512. In one embodiment, edge connector 1512 comprises a PCIe edge connector, although this is merely illustrative of one type of edge connector configuration and is not to be limiting. In addition to an edge connector, an arrayed pin connector may be used, and the orientation of the connector on the bottom of PCB 1510 in FIG. 15 is exemplary, as an edge or arrayed pin connector may be located at an end of the PCB, which is a common configuration for a blade server.

As further shown in FIG. 15, server module 1500 includes a pair of EHF transceiver chips 1508 that are mounted toward the top edge of PCB 1510. This configuration is similar to that shown by Server Blade/Module 402 in FIG. 4d, Server Blade/Module 402b in FIG. 4e, and Server Blade/Module 402c in FIG. 4f. In general, a server module that supports communication via millimeter-wave wireless links may employ one or more EHF transceiver chips, which may be mounted on one or both sides of the modules main board and/or a daughterboard or the like.

Figure 16:
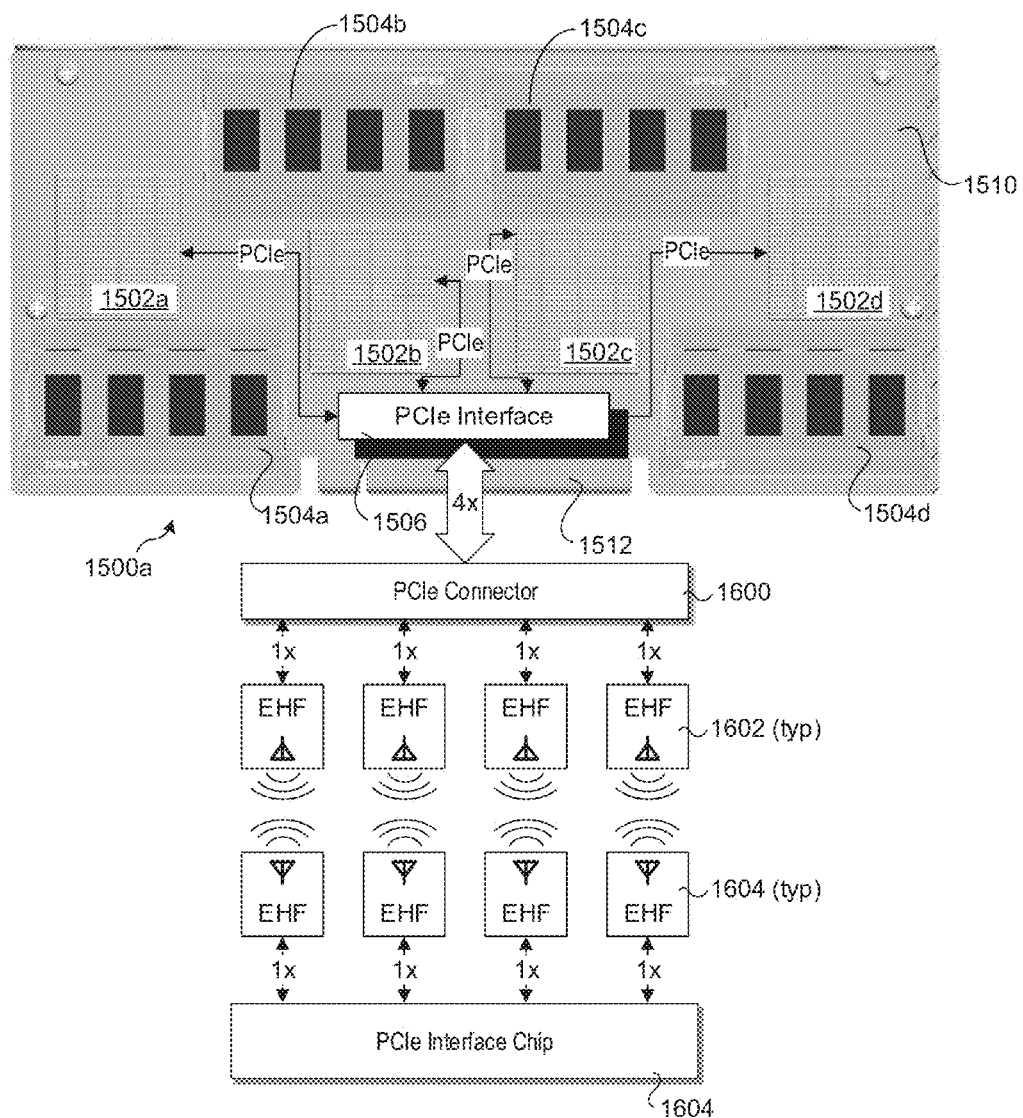
FIG. 16 is a schematic diagram illustrating a technique for combining multiple millimeter-wave wireless links in parallel to increase link bandwidth, according to one embodiment.

FIG. 16 illustrates an example of combining multiple individual millimeter-wave EHF links in parallel to support increased transfer rates across communication interfaces. In the illustrated embodiment, a server module 1500a includes a four lane (4×) PCIe interface 1506, and is coupled to a PCIe connector 1600 supporting four (or more) PCIe lanes. Pins corresponding to respective PCIe differential signal pairs are coupled to the differential TX input pins on each of a first set of EHF transceiver chips 1602, which are wirelessly linked in communication with EHF transceiver chips 1604 on a pairwise basis. In turn, the differential RX output pins on EHF transceiver chips 1604 are coupled to differential signal pair I/O pins on a PCIe interface chip 1606. In general, the technique illustrated in FIG. 16 may be used to support an nx PCIe link wherein n is an integer number of lanes greater than one. For example, standard PCIe multi-lane links may be implemented, such as 2×, 4×, 8×, 16×, etc. PCIe links.

Embodiments implementing the principles and teachings herein provide several advantages over conventional approach. First, by facilitating millimeter-wave wireless links between EHF transceiver chips disposed in separate chassis, components that are directly or indirectly communicatively coupled to EHF transceiver chips are enabled to pass data to and receive data from components in other chassis without using a cable connected between the chassis. This results in a cost savings, and also prevents wiring errors such as might result when connecting a large number of cables between chassis in a rack. Since the EHF transceiver chips are mounted to backplanes and other circuit boards, their implement can be mass produced at a relatively low marginal cost (compared to similar components without the chips). Additionally, since no cable connections are required chassis can be easily removed for racks for maintenance such as replacement or upgrade of server blades or modules without having to disconnect and then reconnect the cables or otherwise need to employ extra cable lengths to allow for maintenance of chassis components.

Further aspects of the subject matter describe herein are set out in the following numbered clauses:

Clause 1. An apparatus, comprising:
a first chassis, configured to be installed in a rack and including a sheet metal base in which a first plurality of holes are formed and having a backplane mounted therein parallel to the sheet metal base and including a first plurality of extremely high frequency (EHF) transceiver chips mounted to its underside, each EHF transceiver chip disposed proximate to a respective hole in the sheet metal base; and a second chassis, configured to be installed in the rack and including at least one of a plurality of blades or modules, wherein at least a portion of the blades or modules includes an EHF transceiver chip that is configured to communicate with a respective EHF transceiver chip in the first plurality of EHF transceiver chips when the first and second chassis are installed in the rack to implement a plurality of millimeter-wave wireless links facilitated by respective pairs of EHF transceiver chips, wherein radio frequency signals for each millimeter-wave wireless link pass through a respective hole in the sheet metal base of the first chassis.

Clause 2. The apparatus of clause 1, wherein the first backplane comprises a storage array backplane including a plurality of Serial ATA (SATA) connectors.

Clause 3. The apparatus of clause 2, wherein at least a portion of the SATA connectors are communicatively coupled to at least one EHF transceiver chip via traces in the first backplane.

Clause 4. The apparatus of any of the proceeding clauses, wherein the first chassis comprises a network/switch chassis, and the first backplane includes switching circuitry and logic communicatively coupled to the first plurality of EHF transceiver chips via traces in the first backplane.

Clause 5. The apparatus of any of the proceeding clauses, wherein the first plurality of EHF transceiver chips are configured in a two-dimensional array.

Clause 6. The apparatus of any of the proceeding clauses, wherein at least one millimeter-wave wireless link facilitated by a pair of EHF transceiver chips has a bandwidth of 6 Gbps.

Clause 7. The apparatus of any of the proceeding clauses, wherein the EHF transceiver chips use a 60 GHz carrier frequency.

Clause 8. The apparatus of any of the proceeding clauses, further wherein the second chassis includes a sheet metal top having a second plurality of holes formed therein, and wherein when the first and second chassis are installed in the rack the first plurality and second plurality of holes are aligned, wherein radio frequency signals for each millimeter-wave wireless link pass through a respective pair of aligned holes in the sheet metal base of the first chassis and the sheet metal top of the second chassis.

Clause 9. The apparatus of any of the proceeding clauses, further wherein at least one server blade or module has an EHF transceiver chip mounted on or operatively coupled to a main board and a metal plate or enclosure operatively coupled to the main board, and the metal plate or enclosure has a hole proximate to the EHF transceiver chip, and wherein radio frequency signals for each millimeter-wave wireless link for the at least one server blade or module pass through the a respective pair of holes in the metal plate or enclosure and the sheet metal base of the first chassis.

Clause 10. The apparatus of any of the proceeding clauses, further comprising a rack, wherein the first and second chassis are installed in the rack.

Clause 11. An apparatus, comprising:
a first chassis, configured to be installed in a first slot of a rack and including a sheet metal base in which a first plurality of holes are formed and having a first backplane mounted therein proximate and parallel to the sheet metal base and including a first plurality of extremely high frequency (EHF) transceiver chips mounted to its underside, each EHF transceiver chip disposed proximate to a respective hole in the sheet metal base;

a second chassis, configured to be installed in the rack in a second slot beneath the first slot having a second backplane mounted therein including a second plurality of EHF transceiver chips mounted to its upward-facing side when the second chassis is installed in the rack, wherein when the first and second chassis are installed in the rack EHF transceiver chips from among the first plurality of EHF transceiver chips are disposed opposite respective EHF transceiver chips from among the second plurality of EHF transceiver chips on a pairwise basis and wherein upon operation of respective pairs of EHF transceiver chips disposed opposite of one another, a plurality of millimeter-wave wireless communication links are facilitated via radio frequency signals that pass through a respective hole in the sheet metal base of the first chassis.

Clause 12. The apparatus of clause 11, wherein the second server chassis includes a sheet metal top having a second plurality of holes formed therein, each hole proximate to a respective EHF transceiver chip among the second plurality of receiver chips in the second backplane, and wherein when the first and second chassis are installed in the rack respective pairs of holes in the first and second plurality of holes are aligned, and wherein radio frequency signals for each of a plurality of millimeter-wave wireless links pass through a respective pair of holes in the sheet metal top of the second chassis and the sheet metal base of the first chassis.

Clause 13. The apparatus of clause 11 or 12, wherein the first chassis comprises a server chassis including at least one backplane to which one of server components are mounted or including a plurality of connectors configured to couple with a respective connector for a server blade or server module that may be installed in the first chassis, wherein each of the at least one backplanes includes a plurality of EHF transceiver chips mounted to its underside.

Clause 14. The apparatus of any of clauses 11-13, wherein the first chassis comprises a server chassis including at least one backplane to which a plurality of server blades or server modules are communicatively coupled, wherein each of the at least one backplanes includes a plurality of EHF transceiver chips mounted to its underside, and wherein each EHF transceiver chip is communicatively coupled to a server blade or server module.

Clause 15. The apparatus of any of clauses 11-14, wherein the second chassis comprises a storage chassis including a plurality of storage drives that are communicatively coupled to the second backplane.

Clause 16. The apparatus of clause 15, wherein multiple storage drives are mounted to a vertical board that in turn is communicatively coupled to the second backplane via a connector.

Clause 17. The apparatus of any of clauses 11-16, wherein the second chassis comprises a network/switch chassis, and the second backplane includes switching circuitry and logic communicatively coupled to the first plurality of EHF transceiver chips via traces in the first backplane.

Clause 18. The apparatus of any of clauses 11-17, wherein each of the first plurality of EHF transceiver chips and the second plurality of EHF transceiver chips are configured in a respective two-dimensional array.

Clause 19. The apparatus of any of clauses 11-18, wherein the EHF transceiver chips use a 60 GHz carrier frequency.

Clause 20. An apparatus comprising:

a chassis frame including a metal base plate in which a plurality of holes are formed; and a backplane, mounted to the chassis frame proximate to the metal base plate, having a plurality of extremely high frequency (EHF) transceiver chips mounted to its underside that are communicatively coupled to switching circuitry mounted on the backplane and a plurality of network connecters that are mounted on the backplane and communicatively coupled to the switching circuitry, wherein the plurality of EHF transceiver chips are aligned with the plurality of holes formed in the metal base plate.

Clause 21. The apparatus of clause 20, wherein the plurality of holes and the plurality of EHF transceiver chips are configured in aligned two-dimensional patterns.

Clause 22. The apparatus of clause 20 or 21, wherein the backplane comprises a first backplane, and wherein the apparatus further comprises a second backplane, having a similar configuration to the first backplane and mounted in the chassis frame toward a metal top plate having a second plurality of holes formed therein, wherein an orientation of the second backplane is vertically-flipped relative to an orientation of the first backplane such that a second plurality of EHF transceiver chips mounted to the second backplane are on a topside of the second backplane and the second plurality of EHF transceiver chips are aligned with respective holes in the metal top plate.

Clause 23. The apparatus of clause 22, further comprising a connection means for communicatively coupling the first backplane to the second backplane.

Clause 24. An apparatus, comprising:

a blade server including;

a frame having an upper plate and a lower plate in which a plurality of holes are formed a main server board, mounted to the frame and to which a plurality of components are operatively coupled, including, at least one processor;

memory;

a first plurality of extremely high frequency (EHF) transceiver chips, each disposed proximate to a respective hole in the upper plate; and a second plurality of EHF transceiver chips, each disposed proximate to a respective hole in the lower plate, wherein each of the EHF transceiver chips is communicatively coupled either directly or indirectly with a processor.

Clause 25. The apparatus of clause 24, further comprising an Input/Output (I/O) interface that is either integrated in a processor or comprising a separate component to which at least one processor is coupled, wherein at least a portion of the EHF transceiver chips are communicatively coupled to the I/O interface.

Clause 26. The apparatus of clause 25, wherein the I/O interface comprises a Peripheral Component Interconnect Express (PCIe) interface, and wherein the PCIe interface is coupled to multiple EHF transceiver chips and the apparatus is configured to implement a multi-lane PCIe link by sending PCIe differential signals for respective lanes to the respective EHF transceiver chips in parallel.

Clause 27. The apparatus of any of clauses 24-26, further comprising:

a chassis, including a plurality of slots configured to receive a respective blade server having a similar configuration to the blade server of clause 21, the chassis further including a bottom plate and a top plate, each having a plurality of rows with multiple holes formed therein, wherein when a blade server is installed in a slot in the chassis the holes in the lower plate of the frame are aligned with respective holes in the bottom plate of the chassis and the holes in the upper plate of the frame are aligned with respective holes in the top plate of the chassis.

Clause 28. An apparatus comprising:
a backplane including a plurality of Peripheral Component Interconnect Express (PCIe) connectors on a first side and a plurality of extremely high frequency (EHF) transceiver chips mounted to a second side, wherein at least one PCIe connector is communicatively coupled to transmit input pins and receive output pins on each of n EHF transceiver chips in a first set of EHF transceiver chips; and
control logic on the backplane for implementing a multi-lane nx PCIe link between a server blade or server module including a first PCIe interface and a second PCIe interface on a second apparatus that is coupled to transmit input pin and receive output pins on each of n EHF transceiver chips in a second set of EHF transceiver chips when the server blade or server module is installed in the backplane, the first set of EHF transceiver chips are disposed within a signaling range of the second set of EHF transceiver chips and the first and second apparatus are operating, wherein respective pairs of EHF transceiver chips in the first and second sets of EHF transceiver chips are configured to implement respective millimeter-wave wireless links, and wherein n>1.

Clause 29. The apparatus of clause 28, wherein the EHF transceiver chips are configured to support a link bandwidth of up to 6 gigabits per second.

Clause 30. The apparatus of clause 28 or 29, wherein the first plurality of EHF transceiver chips are configured in a first pattern, and wherein the apparatus further comprises a chassis frame including a metal base plate through which a plurality of holes are formed having a second pattern, wherein the backplane is mounted to the chassis frame proximate to the metal base plate and the first and second pattern of holes are aligned.

Clause 31. A method, comprising:
communicatively coupling at a first component in a first chassis installed in a rack to a second component in a second chassis installed in the rack immediately above or below the first chassis via at least one pair of extremely high frequency (EHF) transceiver chips configured to transmit and receive millimeter-wave radio frequency (RF) signals,
wherein, for each of the at least one pair of EHF transceiver chips, a first EHF transceiver chip is operatively coupled to the first component in the first chassis and a second EHF transceiver chip is operatively coupled to the second component in the second chassis.

Clause 32. The method of clause 31, wherein each of the millimeter-wave RF signals pass through at least one hole in at least one of the first chassis and second chassis.

Clause 33. The method of clause 31 or 32, wherein at least a portion of the millimeter-wave RF signals pass through respective pairs of holes in the first and second chassis.

Clause 34. The method of any of clauses 31-33, wherein the second component is contained in a metal chassis having a first hole, and millimeter-wave RF signals to facilitate communication between the first component and the second component pass through the first hole, a second hold in the second chassis, and a third hole in the first chassis.

Clause 35. The method of any of clauses 31-34, further comprising communicatively coupling the first component in a first chassis to a plurality of second chassis components in the second chassis including the second component, wherein each of the second chassis components is communicatively coupled to the first chassis component using at least one pair of EHF transceiver chips.

Clause 36. The method of clause 35, wherein the plurality of second components comprise storage devices.

Clause 36. The method of clause 35, wherein the plurality of second components comprise server blades or server modules.

Clause 37. The method of any of clauses 31-36, wherein the first component comprises a backplane having an first side to which a plurality of EHF transceiver chips are mounted, wherein the backplane is located proximate to one of a baseplate or top plate in the first chassis having a plurality of holes, and wherein the plurality of EHF transceiver chips are configured in a first pattern and the plurality of holes are configured in a second pattern substantially matching the first pattern.

Clause 38. The method of any of clauses 31-36, wherein the first component comprises a storage array backplane having a first side on which a plurality of EHF transceiver chips are mounted and a second side on which a plurality of Serial ATA (SATA) connectors are mounted.

Clause 39. The method of any of clauses 31-36, wherein the first chassis comprises a network/switch chassis, and the first component comprises a backplane includes switching circuitry and logic communicatively coupled to a plurality of EHF transceiver chips via traces in the backplane.

Clause 40. The method of any of clauses 31-39, wherein each pair of EHF transceiver chips facilitate a respective millimeter-wave wireless link, and wherein at least one millimeter-wave wireless link has a bandwidth of 6 Gbps.

Clause 41. The method of any of clauses 31-40, wherein the EHF transceiver chips use a 60 GHz carrier frequency.

Clause 42. A method comprising,
communicatively coupling a first backplane to a second backplane via a plurality of millimeter-wave radio frequency (RF) signals transmitted between pairs of extremely high frequency (EHF) transceiver chips, wherein for each pair of EHF transceiver chips a first EHF transceiver chip is mounted to the first backplane and a second EHF transceiver chip is mounted to the second backplane and each pair of EHF transceiver chips facilitate a respective millimeter-wave RF link.

Clause 43. The method of clause 42, wherein the first backplane is mounted in a first chassis and the second backplane is mounted in a second chassis, wherein the first chassis includes a baseplate having a first plurality of holes and the second chassis includes a top plate including a second plurality of holes, and wherein signals for each millimeter-wave RF link pass through a respective hole in each of the baseplate and top plate.

Clause 44. The method of clause 43 or 44, wherein the EHF transceiver chips use a 60 GHz carrier frequency.

Clause 45. The method of any of clauses 42-44, wherein, wherein a first plurality of EHF transceiver chips are mounted to the first backplane and configured in a first pattern and a second plurality of EHF transceiver chips are mounted to the second backplane and configured in a pattern matching the first pattern.

Clause 46. A method comprising:
facilitating communication between a first plurality of components coupled to a backplane in a first chassis with a second plurality of components in a second chassis via a plurality of millimeter-wave radio frequency communication links implemented between pairs of extremely high frequency (EHF) transceiver chips, wherein each pair of EHF transceiver chip includes a first EHF transceiver chip mounted to the backplane and a second EHF transceiver chip operatively coupled to one of the plurality of components in the second chassis Clause 47. The method of clause 46, wherein the first plurality of EHF transceiver chips are configured in a two-dimensional array.

Clause 48. The method of clause 46 or 47, wherein at least a portion of the second plurality of components in the second chassis comprise storage drives.

Clause 49. The method of any of clauses 46-48, wherein the backplane comprises a server backplane.

Clause 50. The method of any of clauses 46-49, wherein the first chassis comprises a server chassis and the second chassis comprises a storage array.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. An apparatus, comprising:
a first chassis, configured to be installed in a first slot of a rack and including a sheet metal base in which a first plurality of holes are formed and having a first backplane mounted therein proximate and parallel to the sheet metal base and including a first plurality of extremely high frequency (EHF) transceiver chips mounted to its underside, each EHF transceiver chip disposed proximate to a respective hole in the sheet metal base;
a second chassis, configured to be installed in the rack in a second slot beneath the first slot having a second backplane mounted therein including a second plurality of EHF transceiver chips mounted to its upward-facing side when the second chassis is installed in the rack,
wherein when the first and second chassis are installed in the rack EHF transceiver chips from among the first plurality of EHF transceiver chips are disposed opposite respective EHF transceiver chips from among the second plurality of EHF transceiver chips on a pairwise basis and wherein upon operation of respective pairs of EHF transceiver chips disposed opposite of one another, a plurality of millimeter-wave wireless communication links are facilitated via radio frequency signals that pass through a respective hole in the sheet metal base of the first chassis, wherein the second server chassis includes a sheet metal top having a second plurality of holes formed therein, each hole proximate to a respective EHF transceiver chip among the second plurality of receiver chips in the second backplane, and wherein when the first and second chassis are installed in the rack respective pairs of holes in the first and second plurality of holes are aligned, and wherein radio frequency signals for each of a plurality of millimeter-wave wireless links pass through a respective pair of holes in the sheet metal top of the second chassis and the sheet metal base of the first chassis.

2. The apparatus of claim 1, wherein the first chassis comprises a server chassis including at least one backplane to which one of server components are mounted or including a plurality of connectors configured to couple with a respective connector for a server blade or server module that may be installed in the first chassis, wherein each of the at least one backplanes includes a plurality of EHF transceiver chips mounted to its underside.

3. The apparatus of claim 1, wherein the first chassis comprises a server chassis including at least one backplane to which a plurality of server blades or server modules are communicatively coupled, wherein each of the at least one backplanes includes a plurality of EHF transceiver chips mounted to its underside, and wherein each EHF transceiver chip is communicatively coupled to a server blade or server module.

4. The apparatus of claim 1, wherein the second chassis comprises a storage chassis including a plurality of storage drives that are communicatively coupled to the second backplane.

5. The apparatus of claim 4, wherein multiple storage drives are mounted to a vertical board that in turn is communicatively coupled to the second backplane via a connector.

6. The apparatus of claim 1, wherein the second chassis comprises a network/switch chassis, and the second backplane includes switching circuitry and logic communicatively coupled to the first plurality of EHF transceiver chips via traces in the first backplane.

7. The apparatus of claim 1, wherein each of the first plurality of EHF transceiver chips and the second plurality of EHF transceiver chips are configured in a respective two-dimensional array.

8. The apparatus of claim 1, wherein the EHF transceiver chips use a 60 GHz carrier frequency.

9. An apparatus comprising:
a chassis frame including a metal base plate in which a plurality of holes are formed;
a backplane, mounted to the chassis frame proximate to the metal base plate, having a plurality of extremely high frequency (EHF) transceiver chips mounted to its underside that are communicatively coupled to switching circuitry mounted on the backplane and a plurality of network connecters that are mounted on the backplane and communicatively coupled to the switching circuitry,
wherein the plurality of EHF transceiver chips are aligned with the plurality of holes formed in the metal base plate,
wherein the backplane comprises a first backplane, and wherein the apparatus further comprises a second backplane, having a similar configuration to the first backplane and mounted in the chassis frame toward a metal top plate having a second plurality of holes formed therein, and
wherein an orientation of the second backplane is vertically-flipped relative to an orientation of the first backplane such that a second plurality of EHF transceiver chips mounted to the second backplane are on a topside of the second backplane and the second plurality of EHF transceiver chips are aligned with respective holes in the metal top plate.

10. The apparatus of claim 9, wherein the plurality of holes and the plurality of EHF transceiver chips are configured in aligned two-dimensional patterns.

11. The apparatus of claim 9, further comprising a connection means for communicatively coupling the first backplane to the second backplane.

12. An apparatus, comprising:
a blade server including;
a frame having an upper plate and a lower plate in which a plurality of holes are formed
a main server board, mounted to the frame and to which a plurality of components are operatively coupled, including,
at least one processor;
memory;
a first plurality of extremely high frequency (EHF) transceiver chips, each disposed proximate to a respective hole in the upper plate; and
a second plurality of EHF transceiver chips, each disposed proximate to a respective hole in the lower plate and;
an Input/Output (I/O) interface that is either integrated in a processor or comprising a separate component to which at least one processor is coupled, wherein at least a portion of the EHF transceiver chips are communicatively coupled to the I/O interface,
wherein each of the EHF transceiver chips is communicatively coupled either directly or indirectly with a processor, wherein the I/O interface comprises a Peripheral Component Interconnect Express (PCIe) interface, and wherein the PCIe interface is coupled to multiple EHF transceiver chips and the apparatus is configured to implement a multi-lane PCIe link by sending PCIe differential signals for respective lanes to the respective EHF transceiver chips in parallel.

13. The apparatus of claim 12, further comprising:
a chassis, including a plurality of slots configured to receive a respective blade server having a similar configuration to the blade server of claim 12, the chassis further including a bottom plate and a top plate, each having a plurality of rows with multiple holes formed therein, wherein when a blade server is installed in a slot in the chassis the holes in the lower plate of the frame are aligned with respective holes in the bottom plate of the chassis and the holes in the upper plate of the frame are aligned with respective holes in the top plate of the chassis.

14. An apparatus comprising:
a backplane including a plurality of Peripheral Component Interconnect Express (PCIe) connectors on a first side and a plurality of extremely high frequency (EHF) transceiver chips mounted to a second side, wherein at least one PCIe connector is communicatively coupled to transmit input pins and receive output pins on each of n EHF transceiver chips in a first set of EHF transceiver chips; and
control logic on the backplane for implementing a multi-lane nx PCIe link between a server blade or server module including a first PCIe interface and a second PCIe interface on a second apparatus that is coupled to transmit input pin and receive output pins on each of n EHF transceiver chips in a second set of EHF transceiver chips, wherein when the server blade or server module is installed in the backplane, the first set of EHF transceiver chips are disposed within a signaling range of the second set of EHF transceiver chips, and wherein respective pairs of EHF transceiver chips in the first and second sets of EHF transceiver chips are configured to implement respective millimeter-wave wireless links, and wherein n>1.

15. The apparatus of claim 14, wherein the EHF transceiver chips are configured to support a link bandwidth of up to 6 gigabits per second.

16. The apparatus of claim 14, wherein the first plurality of EHF transceiver chips are configured in a first pattern, and wherein the apparatus further comprises a chassis frame including a metal base plate through which a plurality of holes are formed having a second pattern, wherein the backplane is mounted to the chassis frame proximate to the metal base plate and the first and second pattern of holes are aligned.

* * * * *